United States Patent
Li et al.

(10) Patent No.: US 11,869,426 B2
(45) Date of Patent: Jan. 9, 2024

(54) PIXEL DRIVING CIRCUIT AND DRIVING METHOD THEREOF, SHIFT REGISTER CIRCUIT AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Yongqian Li, Beijing (CN); Xuehuan Feng, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/763,818

(22) PCT Filed: Apr. 13, 2021

(86) PCT No.: PCT/CN2021/086875
§ 371 (c)(1),
(2) Date: Mar. 25, 2022

(87) PCT Pub. No.: WO2021/223579
PCT Pub. Date: Nov. 11, 2021

(65) Prior Publication Data
US 2022/0343846 A1  Oct. 27, 2022

(30) Foreign Application Priority Data

May 6, 2020 (CN) .......................... 202010372715.5

(51) Int. Cl.
*G09G 3/3233* (2016.01)
*G11C 19/28* (2006.01)
*G09G 3/3266* (2016.01)

(52) U.S. Cl.
CPC .......... *G09G 3/3233* (2013.01); *G11C 19/28* (2013.01); *G09G 3/3266* (2013.01);
(Continued)

(58) Field of Classification Search
None
See application file for complete search history.

(56) References Cited

U.S. PATENT DOCUMENTS 10,930,361 B2  2/2021 Hu et al.
2009/0243991 A1  10/2009 Feng
(Continued)

FOREIGN PATENT DOCUMENTS

CN  107507599 A  12/2017
CN  107863067 A  3/2018
(Continued)

OTHER PUBLICATIONS

KR-20200077929-A (translation) (Year: 2020).*
(Continued)

*Primary Examiner* — Dorothy Harris
(74) *Attorney, Agent, or Firm* — IP & T GROUP LLP

(57) ABSTRACT

A pixel driving circuit includes: a data writing sub-circuit configured to write a data signal received at a data signal terminal into a first node under control of a first scanning signal received at a first scanning signal terminal; a driving sub-circuit configured to drive a light-emitting device coupled to a second node to work under control of a voltage of the first node and a first power supply voltage signal received at a first power supply voltage signal terminal; and a time control sub-circuit configured to transmit a control signal received at a control signal terminal to the first node under control of a second scanning signal received at a second scanning signal terminal after the light-emitting to device works for a preset time, so that the driving sub-circuit (Continued)

is turned off to control the light-emitting device to stop working.

16 Claims, 10 Drawing Sheets

(52) U.S. Cl.
CPC ............... *G09G 2300/0426* (2013.01); *G09G 2300/0842* (2013.01); *G09G 2310/0286* (2013.01); *G09G 2310/08* (2013.01); *G09G 2320/0233* (2013.01); *G09G 2320/0257* (2013.01); *G09G 2330/021* (2013.01)

(56) References Cited

U.S. PATENT DOCUMENTS

| | | |
|---|---|---|
| 2015/0355767 A1 | 12/2015 | Abe et al. |
| 2018/0190192 A1 | 7/2018 | Kwon et al. |
| 2018/0277037 A1* | 9/2018 | Lin ..................... G09G 3/3275 |
| 2019/0074334 A1 | 3/2019 | Jinta |
| 2019/0108809 A1 | 4/2019 | Zheng et al. |
| 2020/0051656 A1* | 2/2020 | Feng .................... G11C 19/287 |
| 2020/0074933 A1* | 3/2020 | Ban ..................... G09G 3/3283 |
| 2020/0090591 A1* | 3/2020 | Wang ................... G09G 3/3233 |
| 2020/0098316 A1 | 3/2020 | Yokoyama et al. |
| 2020/0135287 A1 | 4/2020 | Han |
| 2021/0193028 A1* | 6/2021 | Choi ....................... G09G 3/32 |
| 2021/0201790 A1 | 7/2021 | Gai et al. |
| 2021/0217362 A1 | 7/2021 | Xu et al. |
| 2021/0366400 A1 | 11/2021 | Feng et al. |
| 2021/0407433 A1 | 12/2021 | Wang et al. |
| 2022/0005413 A1 | 1/2022 | Yuan et al. |
| 2022/0208113 A1* | 6/2022 | Choi ..................... G09G 3/3233 |
| 2022/0343857 A1* | 10/2022 | Choi .................... G09G 3/3266 |

FOREIGN PATENT DOCUMENTS

| | | |
|---|---|---|
| CN | 108269537 A | 7/2018 |
| CN | 108288456 A | 7/2018 |
| CN | 108630151 A | 10/2018 |
| CN | 109147641 A | 1/2019 |
| CN | 109166600 A | 1/2019 |
| CN | 109545145 A | 3/2019 |
| CN | 109935184 A | 6/2019 |
| CN | 110036435 A | 7/2019 |
| CN | 110047435 A | 7/2019 |
| CN | 110288949 A | 9/2019 |
| CN | 110517622 A | 11/2019 |
| CN | 110544456 A | 12/2019 |
| CN | 111179851 A | 5/2020 |
| CN | 111445861 A | 7/2020 |
| KR | 10-2020-0003363 A | 1/2020 |
| KR | 20200077929 A * | 7/2020 |
| WO | 2018/173132 A1 | 9/2018 |

OTHER PUBLICATIONS

The First Office Action for the Chinese Patent Application No. 202010372715.5 issued by the Chinese Patent Office dated Dec. 28, 2020.
The Second Office Action for the Chinese Patent Application No. 202010372715.5 issued by the Chinese Patent Office dated Apr. 30, 2021.
Decision of Rejection for the Chinese Patent Application No. 202010372715.5 issued by the Chinese Patent Office dated Aug. 3, 2021.

* cited by examiner

PIXEL DRIVING CIRCUIT AND DRIVING METHOD THEREOF, SHIFT REGISTER CIRCUIT AND DISPLAY APPARATUS

CROSS-REFERENCE TO RELATED APPLICATIONS

This application is a national phase entry under 35 USC 371 of International Patent Application No. PCT/CN2021/086875, filed on Apr. 13, 2021, which claims priority to Chinese Patent Application No. 202010372715.5, filed on May 6, 2020, which are incorporated herein by reference in their entirety.

TECHNICAL FIELD

The present disclosure relates to the field of display technologies, and in particular, to a pixel driving circuit and a driving method thereof, a shift register circuit, and a display apparatus.

BACKGROUND

At present, most display apparatuses pursue characteristics such as high resolution and high picture quality. Organic light-emitting diodes (OLEDs) have advantages of low energy consumption, low production cost, self-luminescence, wide viewing angle, fast response speed and so on, and thus are one of the hot spots in the current research field.

SUMMARY

In an aspect, a pixel driving circuit is provided. The pixel driving circuit includes a data writing sub-circuit, a driving sub-circuit and a time control sub-circuit. The data writing sub-circuit is at least coupled to a first scanning signal terminal, a data signal terminal and a first node, and the data writing sub-circuit is configured to write a data signal received at the data signal terminal into the first node under control of a first scanning signal received at the first scanning signal terminal. The driving sub-circuit is coupled to the first node, a second node and a first power supply voltage signal terminal, and the driving sub-circuit is configured to drive a light-emitting device coupled to the second node to work under control of a voltage of the first node and a first power supply voltage signal received at the first power supply voltage signal terminal. The time control sub-circuit is coupled to the first node, a second scanning signal terminal and a control signal terminal, and the time control sub-circuit is configured to transmit a control signal received at the control signal terminal to the first node under control of a second scanning signal received at the second scanning signal terminal after the light-emitting device works for a preset time, so that the driving sub-circuit is turned off to control the light-emitting device to stop working.

In some embodiments, the time control sub-circuit includes a first transistor. A control electrode of the first transistor is coupled to the second scanning signal terminal, a first electrode of the first transistor is coupled to the control signal terminal, and a second electrode of the first transistor is coupled to the first node.

In some embodiments, the driving sub-circuit includes a second transistor. A control electrode of the second transistor is coupled to the first node, a first electrode of the second transistor is coupled to the second node, and a second electrode of the second transistor is coupled to the first power supply voltage signal terminal.

In some embodiments, the data writing sub-circuit is further coupled to the second node. The data writing sub-circuit includes a third transistor and a storage capacitor. A control electrode of the third transistor is coupled to the first scanning signal terminal, a first electrode of the third transistor is coupled to the data signal terminal, and a second electrode of the third transistor is coupled to the first node. A first electrode of the storage capacitor is coupled to the first node, and a second electrode of the storage capacitor is coupled to the second node.

In some embodiments, the pixel driving circuit further includes a sensing sub-circuit. The sensing sub-circuit is coupled to a third scanning signal terminal, the second node and a sensing signal terminal, and the sensing sub-circuit is configured to transmit a sensing signal received at the sensing signal terminal to the second node under control of a third scanning signal received at the third scanning signal terminal.

In some embodiments, the sensing sub-circuit includes a fourth transistor. A control electrode of the fourth transistor is coupled to the third scanning signal terminal, a first electrode of the fourth transistor is coupled to the sensing signal terminal, and a second electrode of the fourth transistor is coupled to the second node.

In another aspect, a shift register circuit is provided. The shift register circuit is applied to the pixel driving circuit as described in any of the above embodiments. The shift register circuit includes a first output sub-circuit and a second output sub-circuit. The first output sub-circuit is coupled to a first clock signal terminal, a pull-up node and a first signal output terminal, and the first output sub-circuit is configured to transmit a first clock signal received at the first clock signal terminal to the first signal output terminal under control of a voltage of the pull-up node, so as to transmit the first scanning signal to the first scanning signal terminal of the pixel driving circuit. The second output sub-circuit is coupled to a second clock signal terminal, the pull-up node and a second signal output terminal, and the second output sub-circuit is configured to transmit a second clock signal received at the second clock signal terminal to the second signal output terminal under the control of the voltage of the pull-up node, so as to transmit the second scanning signal to the second scanning signal terminal of the pixel driving circuit after the pixel driving circuit drives the light-emitting device to work for the preset time.

In some embodiments, the first output sub-circuit includes a fifth transistor and a first capacitor. A control electrode of the fifth transistor is coupled to the pull-up node, a first electrode of the fifth transistor is coupled to the first clock signal terminal, and a second electrode of the fifth transistor is coupled to the first signal output terminal. A first electrode of the first capacitor is coupled to the pull-up node, and a second electrode of the first capacitor is coupled to the first signal output terminal.

The second output sub-circuit includes a sixth transistor and a second capacitor. A control electrode of the sixth transistor is coupled to the pull-up node, a first electrode of the sixth transistor is coupled to the second clock signal terminal, and a second electrode of the sixth transistor is coupled to the second signal output terminal. A first electrode of the second capacitor is coupled to the pull-up node, and a second electrode of the second capacitor is coupled to the second signal output terminal.

In some embodiments, in a case where the pixel driving circuit includes the sensing sub-circuit, the shift register circuit further includes a third output sub-circuit. The third output sub-circuit is coupled to a third clock signal terminal, the pull-up node and a third signal output terminal, and the third output sub-circuit is configured to transmit a third clock signal received at the third clock signal terminal to the third signal output terminal under the control of the voltage of the pull-up node, so as to transmit the third scanning signal to the third scanning signal terminal of the pixel driving circuit.

In some embodiments, the third output sub-circuit includes a seventh transistor and a third capacitor. A control electrode of the seventh transistor is coupled to the pull-up node, a first electrode of the seventh transistor is coupled to the third clock signal terminal, and a second electrode of the seventh transistor is coupled to the third signal output terminal. A first electrode of the third capacitor is coupled to the pull-up node, and a second electrode of the third capacitor is coupled to the third signal output terminal.

In some embodiments, the shift register circuit further includes a shift signal output sub-circuit. The shift signal output sub-circuit is coupled to a fourth clock signal terminal, the pull-up node and a shift signal output terminal, and the shift signal output sub-circuit is configured to transmit a fourth clock signal received at the fourth clock signal terminal to the shift signal output terminal under the control of the voltage of the pull-up node.

In some embodiments, the shift signal output sub-circuit includes an eighth transistor. A control electrode of the eighth transistor is coupled to the pull-up node, a first electrode of the eighth transistor is coupled to the fourth clock signal terminal, and a second electrode of the eighth transistor is coupled to the shift signal output terminal.

In some embodiments, the shift register circuit further includes a first noise reduction sub-circuit and a second noise reduction sub-circuit. The first noise reduction sub-circuit is coupled to a first pull-down node, the first signal output terminal and a first voltage terminal, and the first noise reduction sub-circuit is configured to transmit a voltage of the first voltage terminal to the first signal output terminal under control of a voltage of the first pull-down node. The second noise reduction sub-circuit is coupled to the first pull-down node, the second signal output terminal and the first voltage terminal, and the second noise reduction sub-circuit is configured to transmit the voltage of the first voltage terminal to the second signal output terminal under the control of the voltage of the first pull-down node.

In a case where the shift register circuit includes the third output sub-circuit, the shift register circuit further includes a third noise reduction sub-circuit. The third noise reduction sub-circuit is coupled to the first pull-down node, a third signal output terminal and the first voltage terminal, and the third noise reduction sub-circuit is configured to transmit the voltage of the first voltage terminal to the third signal output terminal under the control of the voltage of the first pull-down node.

In a case where the shift register circuit includes the shift signal output sub-circuit, the shift register circuit further includes a fourth noise reduction sub-circuit. The fourth noise reduction sub-circuit is coupled to the first pull-down node, the shift signal output terminal and a second voltage terminal, and the fourth noise reduction sub-circuit is configured to transmit a voltage of the second voltage terminal to the shift signal output terminal under the control of the voltage of the first pull-down node.

In some embodiments, the first noise reduction sub-circuit includes a ninth transistor. A control electrode of the ninth transistor is coupled to the first pull-down node, a first electrode of the ninth transistor is coupled to the first voltage terminal, and a second electrode of the ninth transistor is coupled to the first signal output terminal.

The second noise reduction sub-circuit includes a tenth transistor. A control electrode of the tenth transistor is coupled to the first pull-down node, a first electrode of the tenth transistor is coupled to the first voltage terminal, and a second electrode of the tenth transistor is coupled to the second signal output terminal.

In a case where the shift register circuit includes the third noise reduction sub-circuit, the third noise reduction sub-circuit includes an eleventh transistor. A control electrode of the eleventh transistor is coupled to the first pull-down node, a first electrode of the eleventh transistor is coupled to the first voltage terminal, and a second electrode of the eleventh transistor is coupled to the third signal output terminal.

In a case where the shift register circuit includes the fourth noise reduction sub-circuit, the fourth noise reduction sub-circuit includes a twelfth transistor. A control electrode of the twelfth transistor is coupled to the first pull-down node, a first electrode of the twelfth transistor is coupled to the second voltage terminal, and a second electrode of the twelfth transistor is coupled to the shift signal output terminal.

In some embodiments, the shift register circuit further includes a fifth noise reduction sub-circuit and a sixth noise reduction sub-circuit. The fifth noise reduction sub-circuit is coupled to a second pull-down node, the first signal output terminal and a first voltage terminal, and the fifth noise reduction sub-circuit is configured to transmit a voltage of the first voltage terminal to the first signal output terminal under control of a voltage of the second pull-down node. The sixth noise reduction sub-circuit is coupled to the second pull-down node, the second signal output terminal and the first voltage terminal, and the sixth noise reduction sub-circuit is configured to transmit the voltage of the first voltage terminal to the second signal output terminal under the control of the voltage of the second pull-down node.

In a case where the shift register circuit includes the third output sub-circuit, the shift register circuit further includes a seventh noise reduction sub-circuit. The seventh noise reduction sub-circuit is coupled to the second pull-down node, the third signal output terminal and the first voltage terminal, and the seventh noise reduction sub-circuit is configured to transmit the voltage of the first voltage terminal to the third signal output terminal under the control of the voltage of the second pull-down node.

In a case where the shift register circuit includes the shift signal output sub-circuit, the shift register circuit further includes an eighth noise reduction sub-circuit. The eighth noise reduction sub-circuit is coupled to the second pull-down node, the shift signal output terminal and a second voltage terminal, and the eighth noise reduction sub-circuit is configured to transmit a voltage of the second voltage terminal to the shift signal output terminal under the control of the voltage of the second pull-down node.

In some embodiments, the fifth noise reduction sub-circuit includes a thirteenth transistor. A control electrode of the thirteenth transistor is coupled to the second pull-down node, a first electrode of the thirteenth transistor is coupled to the first voltage terminal, and a second electrode of the thirteenth transistor is coupled to the first signal output terminal.

The sixth noise reduction sub-circuit includes a fourteenth transistor. A control electrode of the fourteenth transistor is coupled to the second pull-down node, a first electrode of the fourteenth transistor is coupled to the first voltage terminal, and a second electrode of the fourteenth transistor is coupled to the second signal output terminal.

In a case where the shift register circuit includes the seventh noise reduction sub-circuit, the seventh noise reduction sub-circuit includes a fifteenth transistor. A control electrode of the fifteenth transistor is coupled to the second pull-down node, a first electrode of the fifteenth transistor is coupled to the first voltage terminal, and a second electrode of the fifteenth transistor is coupled to the third signal output terminal.

In a case where the shift register circuit includes the eighth noise reduction sub-circuit, the eighth noise reduction sub-circuit includes a sixteenth transistor. A control electrode of the sixteenth transistor is coupled to the second pull-down node, a first electrode of the sixteenth transistor is coupled to the second voltage terminal, and a second electrode of the sixteenth transistor is coupled to the shift signal output terminal.

In yet another aspect, a gate driving circuit is provided. The gate driving circuit includes a plurality of shift register circuits that are connected in cascade as described in any of the above embodiments.

In yet another aspect, a display apparatus is provided. The display apparatus includes a plurality of pixel driving circuits as described in any of the above embodiments, a plurality of light-emitting devices, and the gate driving circuit as described in the above embodiment. The pixel driving circuit is coupled to at least one light-emitting device. The gate driving circuit is coupled to each pixel driving circuit.

In yet another aspect, a driving method of the pixel driving circuit as described in any of the above embodiments is provided. The driving method includes: writing, by the data writing sub-circuit, the data signal received at the data signal terminal into the first node under the control of the first scanning signal received at the first scanning signal terminal; driving, by the driving sub-circuit, the light-emitting device coupled to the second node to work under the control of the voltage of the first node and the first power supply voltage signal received at the first power supply voltage signal terminal; and transmitting, by the time control sub-circuit, the control signal received at the control signal terminal to the first node under the control of the second scanning signal received at the second scanning signal terminal after the light-emitting device works for the preset time, so that the driving sub-circuit is turned off to control the light-emitting device to stop working.

In some embodiments, in a case where the pixel driving circuit includes the sensing sub-circuit, the driving method further includes:

transmitting, by the sensing sub-circuit, the sensing signal received at the sensing signal terminal to the second node under the control of the third scanning signal received at the third scanning signal terminal, while the data writing sub-circuit writes the data signal into the first node.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
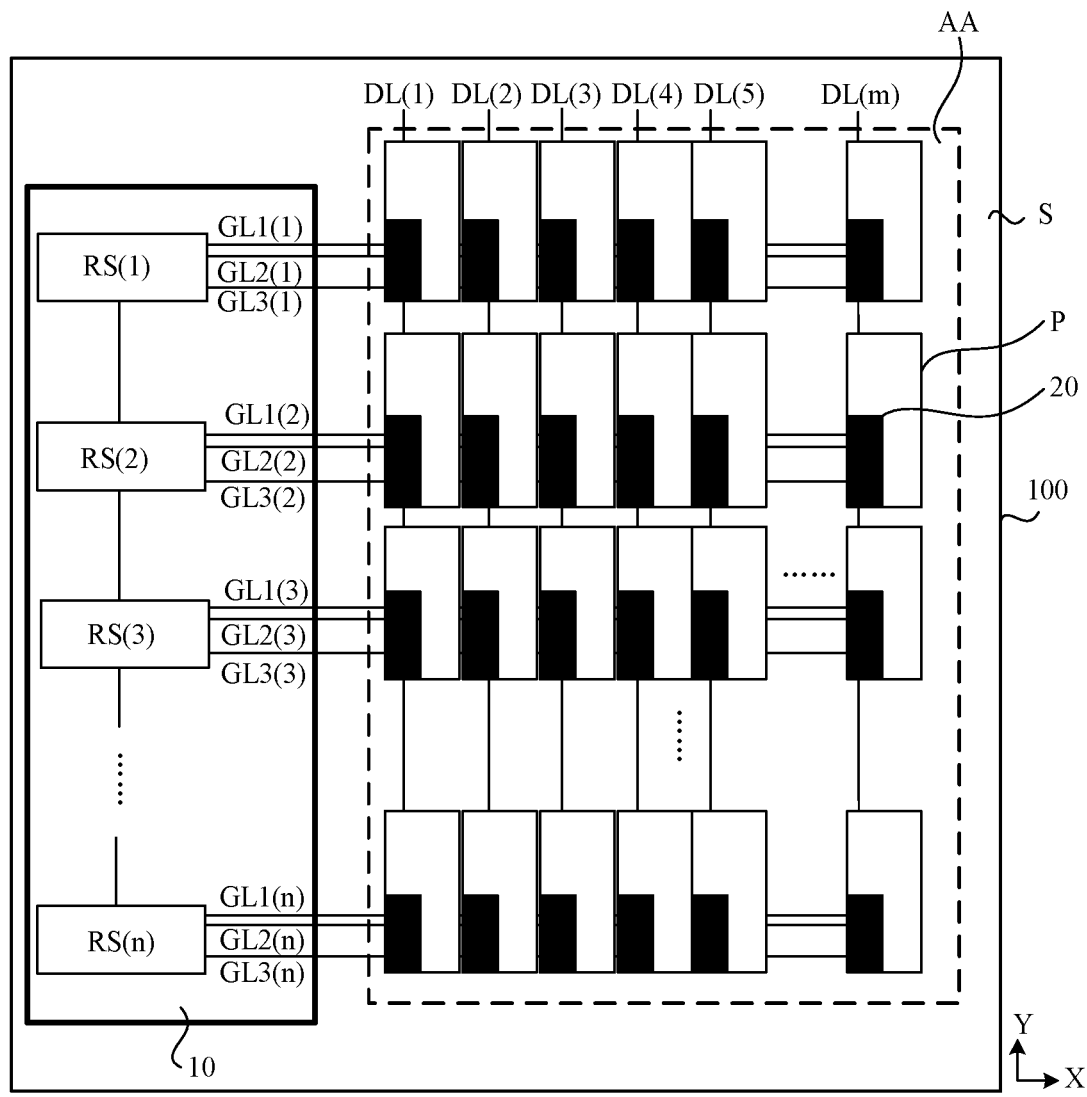
FIG. 1 is a structural diagram of a display apparatus, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meanings, i.e., "including, but not limited to". In the description of the specification, the terms such as "one embodiment", "some embodiments", "exemplary embodiments", "example", "specific example" and "some examples" are intended to indicate that specific features, structures or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, terms such as "coupled" and "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. The term "coupled" or "communicatively coupled", however, may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of "applicable to" or "configured to" herein means an open and inclusive expression, which does not exclude devices that are applicable to or configured to perform additional tasks or steps.

Embodiments of the present disclosure provide a display apparatus.

As shown in FIG. 1, the display apparatus 200 includes a display panel 100. The display panel 100 has a display area AA, and a peripheral area S located on at least one side of the display area AA.

As shown in FIG. 1, the display panel 100 includes a plurality of sub-pixels P disposed in the display area AA.

It will be noted that, FIG. 1 illustrates an example in which the plurality of sub-pixels P are arranged in an array of n rows and m columns, but the embodiments of the present disclosure are not limited thereto, and the plurality of sub-pixels P may also be arranged in other ways. Sub-pixels P arranged in a line in a horizontal direction X are referred to as the same row of sub-pixels, and sub-pixels P arranged in a line in a vertical direction Y are referred to as the same column of sub-pixels.

In some embodiments, as shown in FIG. 1, the sub-pixel P includes a pixel driving circuit 20.

Figure 2:
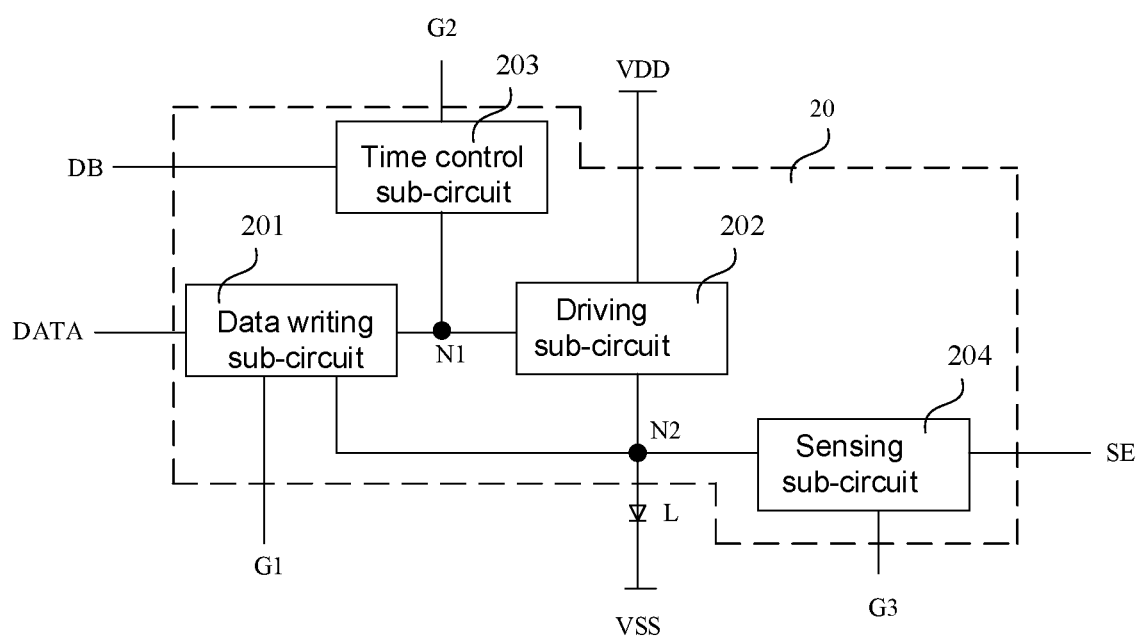
FIG. 2 is a structural diagram of a pixel driving circuit, in accordance with some embodiments.

As shown in FIG. 2, the pixel driving circuit 20 is coupled to at least one light-emitting device L, and the pixel driving circuit 20 is used to drive the light-emitting device(s) L to emit light.

The light-emitting device L is further electrically connected to a second power supply voltage signal terminal VSS.

For example, the second power supply voltage signal terminal VSS transmits a direct-current (DC) low-level signal.

For example, the light-emitting device L is an OLED or a light-emitting diode (LED). In this case, a working time described herein may be understood as a light-emitting duration of the light-emitting device L; and a first electrode and a second electrode of the light-emitting device L are an anode and a cathode of the OLED or LED.

In a process of switching motion images, if the working time of the light-emitting device L is long, in a process of switching a display image of an image frame to a display image of a next image frame, the display image of the image frame will have smear, which affects the display image of the next image frame and results in smear (i.e., motion blur), thereby reducing display effect.

Some embodiments of the present disclosure provide the pixel driving circuit 20. As shown in FIG. 2, the pixel driving circuit 20 includes a data writing sub-circuit 201, a driving sub-circuit 202 and a time control sub-circuit 203.

The data writing sub-circuit 201 is at least coupled to a first scanning signal terminal G1, a data signal terminal DATA and a first node N1.

The driving sub-circuit 202 is coupled to the first node N1, a second node N2 and a first power supply voltage signal terminal VDD.

The time control sub-circuit 203 is coupled to the first node N1, a second scanning signal terminal G2 and a control signal terminal DB.

The data writing sub-circuit 201 is configured to write a data signal received at the data signal terminal DATA into the first node N1 under control of a first scanning signal received at the first scanning signal terminal G1.

The driving sub-circuit 202 is configured to drive the light-emitting device L coupled to the second node N2 to work under control of a voltage of the first node N1 and a first power supply voltage signal received at the first power supply voltage signal terminal VDD.

For example, the first power supply voltage signal is a DC high-level signal.

The time control sub-circuit 203 is configured to transmit a control signal received at the control signal terminal DB to the first node N1 under control of a second scanning signal received at the second scanning signal terminal G2 after the light-emitting device L works for a preset time, so that the driving sub-circuit 202 is turned off to control the light-emitting device L to stop working.

The preset time for which the light-emitting device L works refers to a time for which the light-emitting device L normally emits light so that the display apparatus displays a normal image. In a case where the light-emitting device L stops working, the light-emitting device L does not emit light, so as to cause the display apparatus to display a black image.

It will be noted that the preset time for which the light-emitting device L works may be set according to a requirement that the display apparatus actually displays the normal image, which is not limited thereto.

Moreover, it is possible for a person skilled in the art to set a magnitude of a voltage of the control signal on a premise of ensuring that the display apparatus displays the black image after the light-emitting device L works for the preset time. For example, the control signal received at the control signal terminal DB is a fixed voltage signal, e.g., a DC low-level signal; or the control signal is a signal whose voltage is varied within a set voltage range, e.g., a black insertion signal, and the signal whose voltage is within the set voltage range can control the light-emitting device L to stop working.

In this case, compared to a case where the light-emitting device L continuously works before switching to the next image frame in a process of switching image frames, in the embodiments of the present disclosure, after the light-emitting device L works for the preset time, the light-emitting device L stops working, that is, the light-emitting device L stops emitting light, which shortens the working time of the light-emitting device L. As a result, before switching to the next image frame, the display apparatus may present the black image for a period of time, which prolongs a motion picture response time (MPRT), thereby avoiding motion blur in the process of switching image frames due to continuous working of the light-emitting device L, and improving the display effect.

Therefore, in the pixel driving circuit 20 provided in the embodiments of the present disclosure, the time control sub-circuit 203 transmits the control signal received at the control signal terminal DB to the first node N1 after the light-emitting device L works for the preset time, so that the driving sub-circuit 202 is turned off to control the light-emitting device L to stop working, i.e., to control the light-emitting device L to stop emitting light. Compared to the case where the light-emitting device L continuously works before switching to the next image frame in the process of switching image frames, the working time of the light-emitting device L is shortened in the embodiments of the present disclosure. As a result, the display apparatus may present the black picture within a period of time before switching to the next image frame, which prolongs the MPRT, thereby avoiding the motion blur in the process of switching image frames due to the continuous working of the light-emitting device L, and improving the display effect. Moreover, the higher a refresh frequency of the display apparatus, the longer the MPRT, and the less an influence of motion blur on the display effect.

Figure 3:
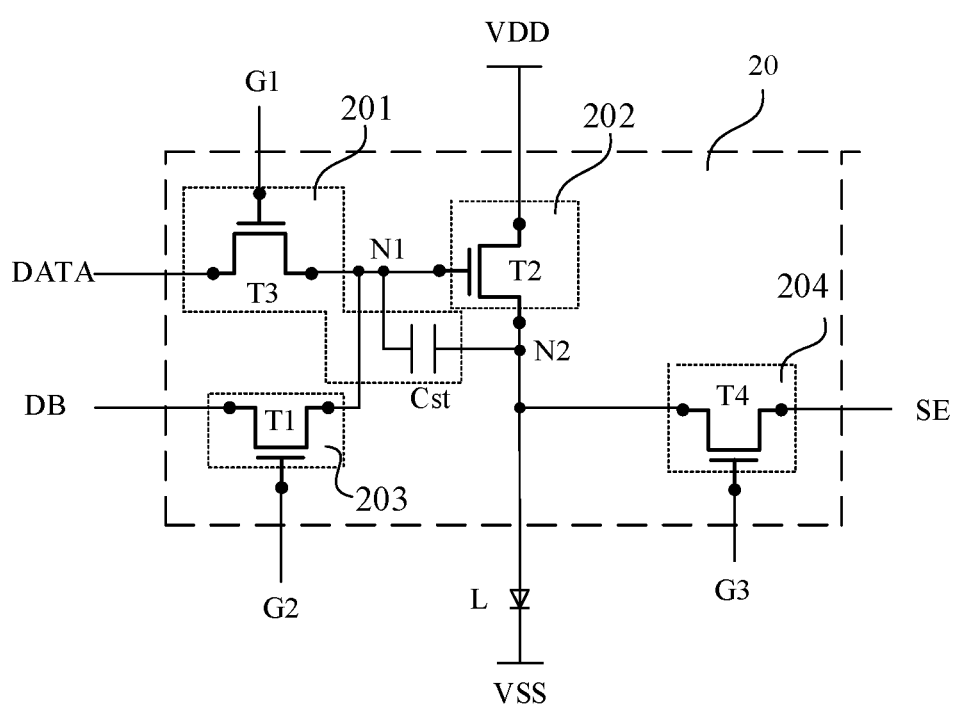
FIG. 3 is a structural diagram of another pixel driving circuit, in accordance with some embodiments.

For example, as shown in FIG. 3, the time control sub-circuit 203 includes a first transistor T1.

A control electrode of the first transistor T1 is coupled to the second scanning signal terminal G2, a first electrode of the first transistor T1 is coupled to the control signal terminal DB, and a second electrode of the first transistor T1 is coupled to the first node N1.

For example, as shown in FIG. 3, the driving sub-circuit 202 includes a second transistor T2.

A control electrode of the second transistor T2 is coupled to the first node N1, a first electrode of the second transistor T2 is coupled to the second node N2, and a second electrode of the second transistor T2 is coupled to the first power supply voltage signal terminal VDD.

For example, as shown in FIG. 3, the data writing sub-circuit 201 is further coupled to the second node N2. The data writing sub-circuit 201 includes a third transistor T3 and a storage capacitor Cst.

A control electrode of the third transistor T3 is coupled to the first scanning signal terminal G1, a first electrode of the third transistor T3 is coupled to the data signal terminal DATA, and a second electrode of the third transistor T3 is coupled to the first node N1.

A first electrode of the storage capacitor Cst is coupled to the first node N1, and a second electrode of the storage capacitor Cst is coupled to the second node N2.

In some embodiments, as shown in FIG. 2, the pixel driving circuit 20 further includes a sensing sub-circuit 204.

The sensing sub-circuit 204 is coupled to a third scanning signal terminal G3, the second node N2 and a sensing signal terminal SE.

The sensing sub-circuit 204 is configured to transmit a sensing signal received at the sensing signal terminal SE to the second node N2 under control of a third scanning signal received at the third scanning signal terminal G3.

In this case, the display panel 100 further includes sensing signal lines (not shown in figures). The sensing signal line is coupled to the sensing signal terminal SE. The sensing signal line supplies the sensing signal to the sensing signal terminal SE.

In addition, the display apparatus further includes an external compensation circuit (not shown in the figures). The sensing signal lines are coupled to the external compensation circuit. The sensing sub-circuit 204 is further configured to transmit a voltage of the second node N2 to the sensing signal terminal SE under the control of the third scanning signal received at the third scanning signal terminal G3 in a period in which the light-emitting device L does not work.

In this case, the sensing signal line transmits the voltage of the second node N2 to the external compensation circuit, and the external compensation circuit adjusts the data signal received at the data signal terminal DATA in a subsequent display process according to the voltage of the second node N2. In this way, a threshold voltage of the second transistor T2 in the driving sub-circuit 202 may be compensated by means of external compensation, thereby avoiding difference in a driving current provided by the driving sub-circuit 202 to the light-emitting device L, and improving brightness uniformity of the display apparatus.

For example, as shown in FIG. 3, the sensing sub-circuit 204 includes a fourth transistor T4.

A control electrode of the fourth transistor T4 is coupled to the third scanning signal terminal G3, a first electrode of the fourth transistor T4 is coupled to the sensing signal terminal SE, and a second electrode of the fourth transistor T4 is coupled to the second node N2.

In some embodiments, the control signal terminal DB and the sensing signal terminal SE are coupled to each other.

Figure 4:
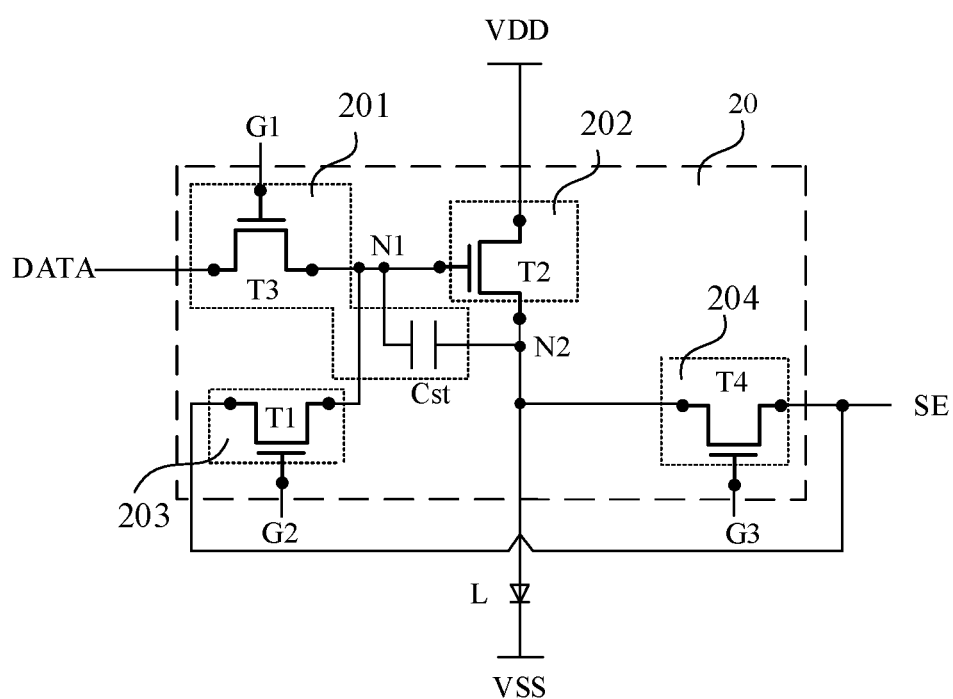
FIG. 4 is a structural diagram of yet another pixel driving circuit, in accordance with some embodiments.

For example, as shown in FIG. 4, in a case where the time control sub-circuit 203 includes the first transistor T1, the first electrode of the first transistor T1 is coupled to the sensing signal terminal SE.

In this case, it is possible to reduce the number of signal terminals of the pixel driving circuit 20, reduce the number of signal lines coupled to the signal terminals, and enlarge a wiring space of the display panel 100.

In some embodiments, the first scanning signal terminal G1 and the third scanning signal terminal G3 are coupled to each other.

It will be understood that the data writing sub-circuit 201 and the sensing sub-circuit 204 are turned on synchronously.

Figure 5:
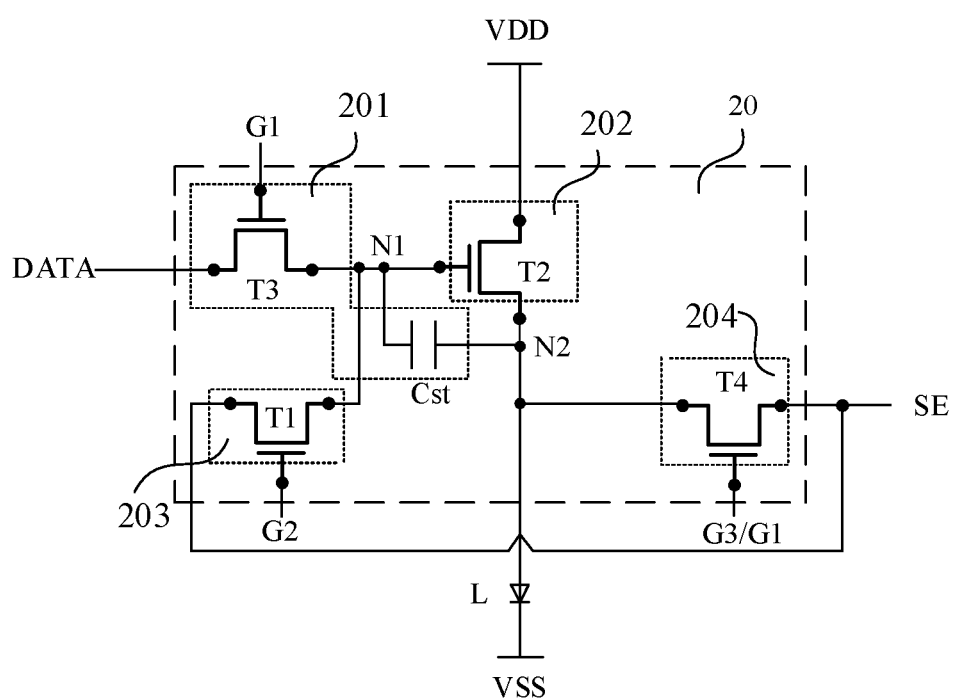
FIG. 5 is a structural diagram of yet another pixel driving circuit, in accordance with some embodiments.

For example, as shown in FIG. 5, in a case where the sensing sub-circuit 204 includes the fourth transistor T4, the control electrode of the fourth transistor T4 is coupled to the first scanning signal terminal G1.

In this case, the number of signal terminals of the pixel driving circuit 20 is reduced, the number of signal lines coupled to the signal terminals is reduced, and the wiring space of the display panel 100 is enlarged.

Embodiments of the present disclosure provide a shift register circuit RS. The shift register circuit RS is applied to the pixel driving circuit 20 in any of the above embodiments.

Figure 6:
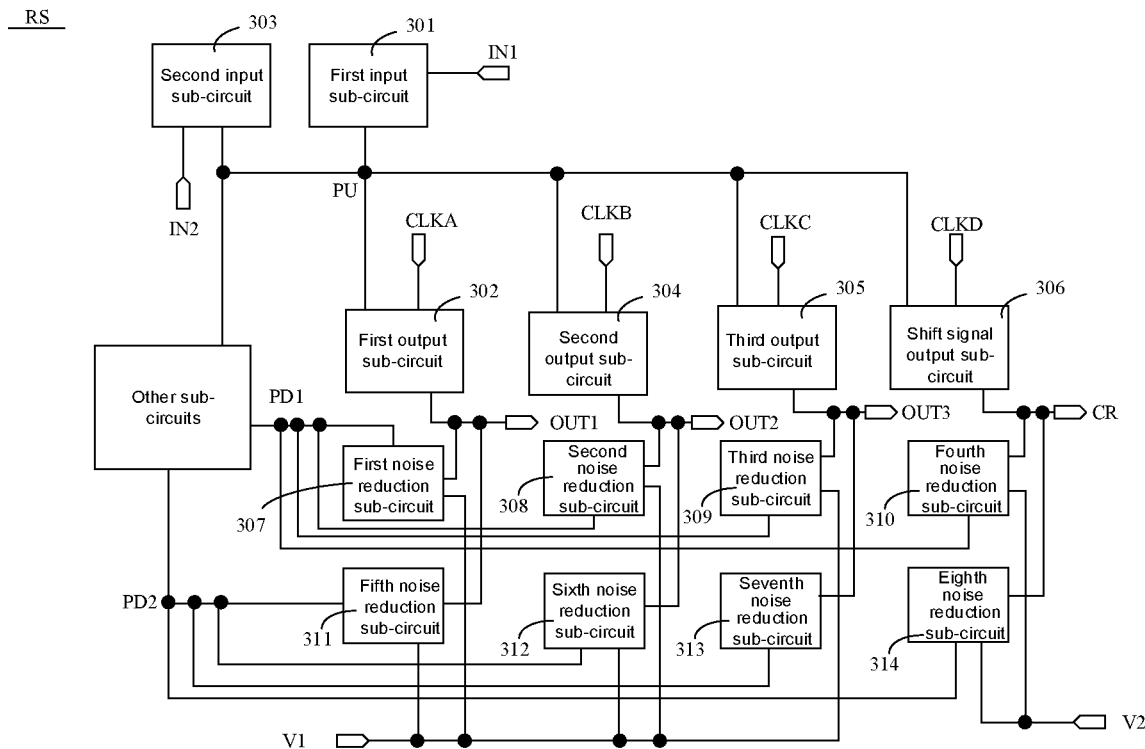
FIG. 6 is a structural diagram of a shift register circuit, in accordance with some embodiments.

As shown in FIG. 6, the shift register circuit RS includes a first input sub-circuit 301, a first output sub-circuit 302, a second input sub-circuit 303 and a second output sub-circuit 304.

The first input sub-circuit 301 is at least coupled to a pull-up node PU and a first signal input terminal IN1.

The first output sub-circuit 302 is coupled to a first clock signal terminal CLKA, the pull-up node PU and a first signal output terminal OUT1.

The second input sub-circuit 303 is at least coupled to the pull-up node PU and a second signal input terminal IN2.

The second output sub-circuit 304 is coupled to a second clock signal terminal CLKB, the pull-up node PU and a second signal output terminal OUT2.

The first input sub-circuit 301 is configured to transmit a signal received at the first signal input terminal IN1 to the pull-up node PU.

The first output sub-circuit 302 is configured to transmit a first clock signal received at the first clock signal terminal CLKA to the first signal output terminal OUT1 under control of a voltage of the pull-up node PU, so as to transmit the first scanning signal to the first scanning signal terminal G1 of the pixel driving circuit 20.

The second input sub-circuit 303 is configured to transmit a signal received at the second signal input terminal IN2 to the pull-up node PU after the pixel driving circuit 20 drives the light-emitting device L to work for the preset time.

The second output sub-circuit 304 is configured to transmit a second clock signal received at the second clock signal terminal CLKB to the second signal output terminal OUT2 under the control of the voltage of the pull-up node, so as to transmit the second scanning signal to the second scanning signal terminal G2 of the pixel driving circuit 20 after the pixel driving circuit 20 drives the light-emitting device L to work for the preset time.

In some embodiments, the first signal input terminal IN1 and the second signal input terminal IN2 are coupled to each other.

Figure 7:
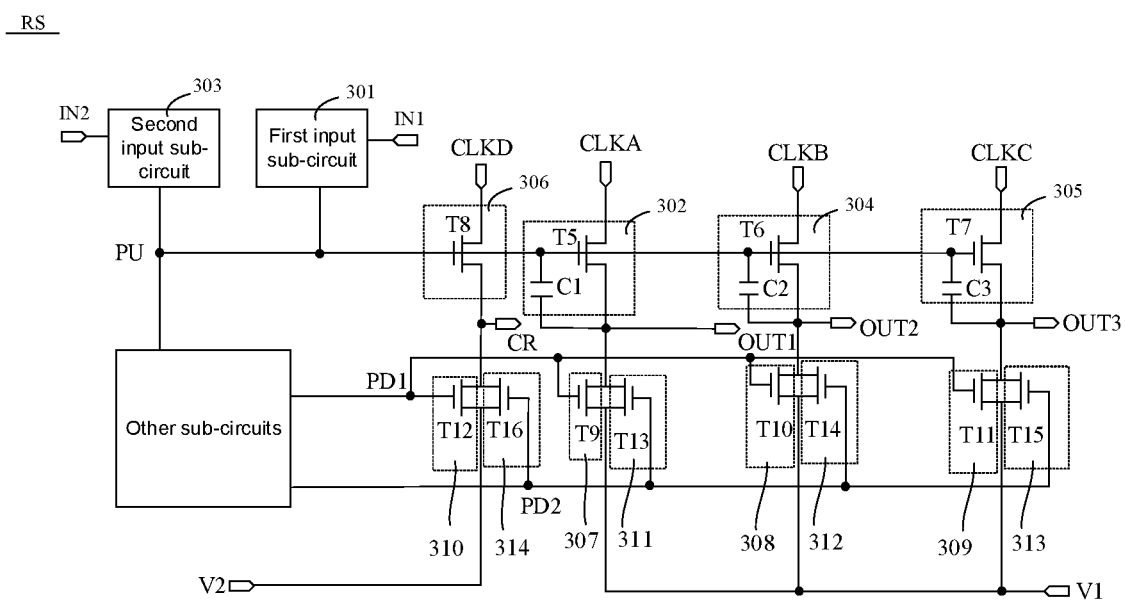
FIG. 7 is another structural diagram of a shift register circuit, in accordance with some embodiments.

For example, as shown in FIG. 7, the first output sub-circuit 302 includes a fifth transistor T5 and a first capacitor C1.

A control electrode of the fifth transistor T5 is coupled to the pull-up node PU, a first electrode of the fifth transistor T5 is coupled to the first clock signal terminal CLKA, and a second electrode of the fifth transistor T5 is coupled to the first signal output terminal OUT1.

A first electrode of the first capacitor C1 is coupled to the pull-up node PU, and a second electrode of the first capacitor C1 is coupled to the first signal output terminal OUT1.

For example, as shown in FIG. 7, the second output sub-circuit 304 includes a sixth transistor T6 and a second capacitor C2.

A control electrode of the sixth transistor T6 is coupled to the pull-up node PU, a first electrode of the sixth transistor T6 is coupled to the second clock signal terminal CLKB, and a second electrode of the sixth transistor T6 is coupled to the second signal output terminal OUT2.

A first electrode of the second capacitor C2 is coupled to the pull-up node PU, and a second electrode of the second capacitor C2 is coupled to the second signal output terminal OUT2.

It will be noted that, specific structures of the first input sub-circuit 301 and the second input sub-circuit 303 may be set by using any circuit or module capable of achieving corresponding functions in the art, which may be selected by a person skilled in the art according to situations in practical applications, and the present disclosure is not limited thereto.

In some embodiments, in a case where the pixel driving circuit 20 includes the sensing sub-circuit 204, as shown in FIG. 6, the shift register circuit RS further includes a third output sub-circuit 305.

The third output sub-circuit 305 is coupled to a third clock signal terminal CLKC, the pull-up node PU and a third signal output terminal OUT3.

The third output sub-circuit 305 is configured to transmit a third clock signal received at the third clock signal terminal CLKC to the third signal output terminal OUT3 under the control of the voltage of the pull-up node PU, so as to transmit the third scanning signal to the third scanning signal terminal G3 of the pixel driving circuit 20.

For example, as shown in FIG. 7, the third output sub-circuit 305 includes a seventh transistor T7 and a third capacitor C3.

A control electrode of the seventh transistor T7 is coupled to the pull-up node PU, a first electrode of the seventh transistor T7 is coupled to the third clock signal terminal CLKC, and a second electrode of the seventh transistor T7 is coupled to the third signal output terminal OUT3.

A first electrode of the third capacitor C3 is coupled to the pull-up node PU, and a second electrode of the third capacitor C3 is coupled to the third signal output terminal OUT3.

In some embodiments, as shown in FIG. 6, the shift register circuit RS further includes a shift signal output sub-circuit 306.

The shift signal output sub-circuit 306 is coupled to a fourth clock signal terminal CLKD, the pull-up node PU and a shift signal output terminal CR.

The shift signal output sub-circuit 306 is configured to transmit a fourth clock signal received at the fourth clock signal terminal CLKD to the shift signal output terminal CR under the control of the voltage of the pull-up node PU.

For example, as shown in FIG. 7, the shift signal output sub-circuit 306 includes an eighth transistor T8.

A control electrode of the eighth transistor T8 is coupled to the pull-up node PU, a first electrode of the eighth transistor T8 is coupled to the fourth clock signal terminal CLKD, and a second electrode of the eighth transistor T8 is coupled to the shift signal output terminal CR.

In some embodiments, as shown in FIG. 6, the shift register circuit RS further includes a first noise reduction sub-circuit 307 and a second noise reduction sub-circuit 308.

The first noise reduction sub-circuit 307 is coupled to a first pull-down node PD1, the first signal output terminal OUT1 and a first voltage terminal V1.

The second noise reduction sub-circuit 308 is coupled to the first pull-down node PD1, the second signal output terminal OUT2 and the first voltage terminal V1.

The first noise reduction sub-circuit 307 is configured to transmit a voltage of the first voltage terminal V1 to the first signal output terminal OUT1 under control of a voltage of the first pull-down node PD1, so as to reduce noise of the first signal output terminal OUT1.

The second noise reduction sub-circuit 308 is configured to transmit the voltage of the first voltage terminal V1 to the second signal output terminal OUT2 under the control of the voltage of the first pull-down node PD1, so as to reduce noise of the second signal output terminal OUT2.

The first voltage terminal V1 is configured to transmit a DC low-level signal.

For example, as shown in FIG. 7, the first noise reduction sub-circuit 307 includes a ninth transistor T9.

A control electrode of the ninth transistor T9 is coupled to the first pull-down node PD1, a first electrode of the ninth transistor T9 is coupled to the first voltage terminal V1, and a second electrode of the ninth transistor T9 is coupled to the first signal output terminal OU1.

For example, as shown in FIG. 7, the second noise reduction sub-circuit 308 includes a tenth transistor T10.

A control electrode of the tenth transistor T10 is coupled to the first pull-down node PD1, a first electrode of the tenth transistor T10 is coupled to the first voltage terminal V1, and a second electrode of the tenth transistor T10 is coupled to the second signal output terminal OUT2.

In some embodiments, in a case where the shift register circuit RS includes the third output sub-circuit 305, as shown in FIG. 6, the shift register circuit RS further includes a third noise reduction sub-circuit 309.

The third noise reduction sub-circuit 309 is coupled to the first pull-down node PD1, a third signal output terminal OUT3 and the first voltage terminal V1.

The third noise reduction sub-circuit 309 is configured to transmit the voltage of the first voltage terminal V1 to the third signal output terminal OUT3 under the control of the voltage of the first pull-down node PD1, so as to reduce noise of the third signal output terminal OUT3.

For example, as shown in FIG. 7, the third noise reduction sub-circuit 309 includes an eleventh transistor T11.

A control electrode of the eleventh transistor T11 is coupled to the first pull-down node PD1, a first electrode of the eleventh transistor T11 is coupled to the first voltage terminal V1, and a second electrode of the eleventh transistor T11 is coupled to the third signal output terminal OUT3.

In some embodiments, in a case where the shift register circuit RS includes the shift signal output sub-circuit 306, as shown in FIG. 6, the shift register circuit RS further includes a fourth noise reduction sub-circuit 310.

The fourth noise reduction sub-circuit 310 is coupled to the first pull-down node PD1, the shift signal output terminal CR and a second voltage terminal V2.

The fourth noise reduction sub-circuit 310 is configured to transmit a voltage of the second voltage terminal V2 to the shift signal output terminal CR under the control of the voltage of the first pull-down node PD1, so as to reduce noise of the shift signal output terminal CR.

The second voltage terminal V2 is configured to transmit a DC low-level signal.

A voltage of the DC low-level signal transmitted by the second voltage terminal V2 is less than a voltage of the DC low-level signal transmitted by the first voltage terminal V1.

For example, as shown in FIG. 7, the fourth noise reduction sub-circuit 310 includes a twelfth transistor T12.

A control electrode of the twelfth transistor T12 is coupled to the first pull-down node PD1, a first electrode of the twelfth transistor T12 is coupled to the second voltage terminal V2, and a second electrode of the twelfth transistor T12 is coupled to the shift signal output terminal CR.

In some embodiments, as shown in FIG. 6, the shift register circuit RS further includes a fifth noise reduction sub-circuit 311 and a sixth noise reduction sub-circuit 312.

The fifth noise reduction sub-circuit 311 is coupled to a second pull-down node PD2, the first signal output terminal OUT1 and the first voltage terminal V1.

The sixth noise reduction sub-circuit 312 is coupled to the second pull-down node PD2, the second signal output terminal OUT2 and the first voltage terminal V1.

The fifth noise reduction sub-circuit 311 is configured to transmit the voltage of the first voltage terminal V1 to the first signal output terminal OUT1 under control of a voltage of the second pull-down node PD2, so as to reduce the noise of the first signal output terminal OUT1.

The sixth noise reduction sub-circuit 312 is configured to transmit the voltage of the first voltage terminal V1 to the second signal output terminal OUT2 under the control of the voltage of the second pull-down node PD2, so as to reduce the noise of the second signal output terminal OUT2.

For example, as shown in FIG. 7, the fifth noise reduction sub-circuit 311 includes a thirteenth transistor T13.

A control electrode of the thirteenth transistor T13 is coupled to the second pull-down node PD2, a first electrode of the thirteenth transistor T13 is coupled to the first voltage terminal V1, and a second electrode of the thirteenth transistor T13 is coupled to the first signal output terminal OUT1.

For example, as shown in FIG. 7, the sixth noise reduction sub-circuit 312 includes a fourteenth transistor T14.

A control electrode of the fourteenth transistor T14 is coupled to the second pull-down node PD2, a first electrode of the fourteenth transistor T14 is coupled to the first voltage terminal V1, and a second electrode of the fourteenth transistor T14 is coupled to the second signal output terminal OUT2.

In some embodiments, in the case where the shift register circuit RS includes the third output sub-circuit 305, as shown in FIG. 6, the shift register circuit RS further includes a seventh noise reduction sub-circuit 313.

The seventh noise reduction sub-circuit 313 is coupled to the second pull-down node PD2, the third signal output terminal OUT3 and the first voltage terminal V1.

The seventh noise reduction sub-circuit 313 is configured to transmit the voltage of the first voltage terminal V1 to the third signal output terminal OUT3 under the control of the voltage of the second pull-down node PD2, so as to reduce the noise of the third signal output terminal OUT3.

For example, as shown in FIG. 7, the seventh noise reduction sub-circuit 313 includes a fifteenth transistor T15.

A control electrode of the fifteenth transistor T15 is coupled to the second pull-down node PD2, a first electrode of the fifteenth transistor T15 is coupled to the first voltage terminal V1, and a second electrode of the fifteenth transistor T15 is coupled to the third signal output terminal OUT3.

In some embodiments, in the case where the shift register circuit RS includes the shift signal output sub-circuit 306, as shown in FIG. 6, the shift register circuit RS further includes an eighth noise reduction sub-circuit 314.

The eighth noise reduction sub-circuit 314 is coupled to the second pull-down node PD2, the shift signal output terminal CR and the second voltage terminal V2.

The eighth noise reduction sub-circuit 314 is configured to transmit the voltage of the second voltage terminal V2 to the shift signal output terminal CR under the control of the voltage of the second pull-down node PD2, so as to reduce the noise of the shift signal output terminal CR.

For example, as shown in FIG. 7, the eighth noise reduction sub-circuit 314 includes a sixteenth transistor T16.

A control electrode of the sixteenth transistor T16 is coupled to the second pun-down node PD2, a first electrode of the sixteenth transistor T16 is coupled to the second voltage terminal V2, and a second electrode of the sixteenth transistor T16 is coupled to the shift signal output terminal CR.

Figure 8:
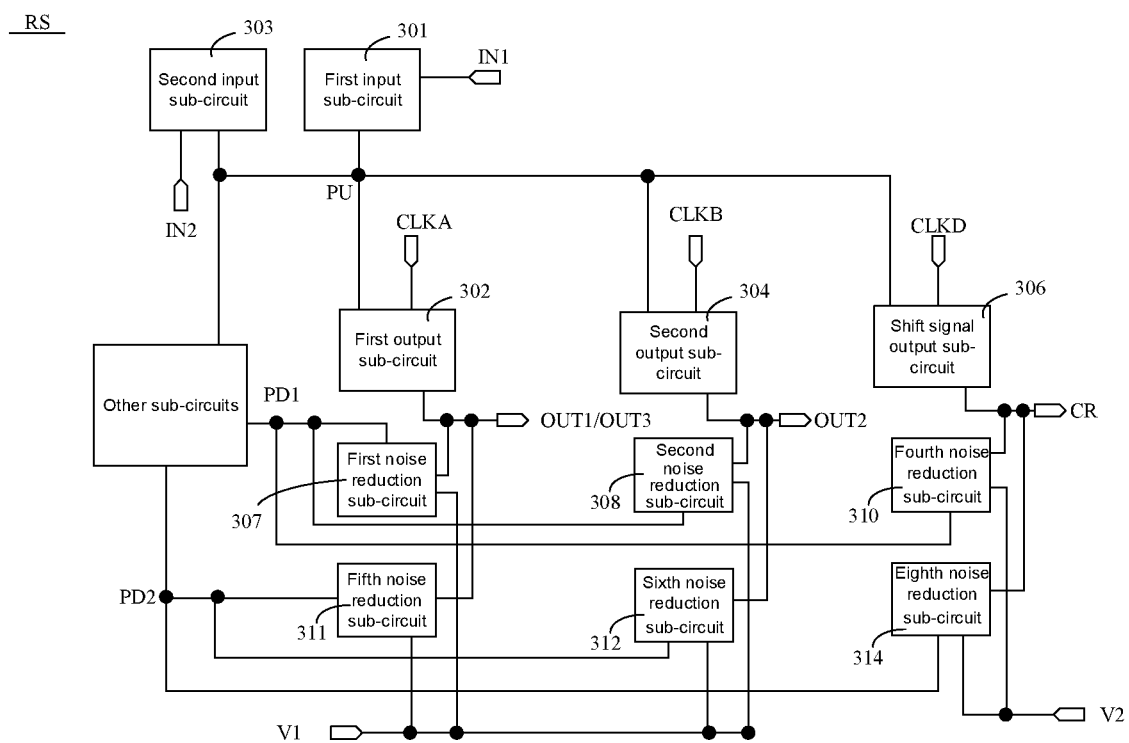
FIG. 8 is a structural diagram of yet another shift register circuit, in accordance with some embodiments.

In some embodiments, in a case where the first scanning signal terminal G1 and the third scanning signal terminal G3 of the pixel driving circuit 20 are coupled to each other, as shown in FIG. 8, the first signal output terminal OUT1 and the third signal output terminal OUT3 of the shift register circuit RS are coupled to each other.

In this case, for the shift register circuit RS, by controlling the first output sub-circuit 302, the first noise reduction sub-circuit 307 and the fifth noise reduction sub-circuit 311, an output signal of the third signal output terminal OUT3 is controlled, so that the third scanning signal is transmitted to the third scanning signal terminal G3 of the pixel driving circuit 20. In this way, a circuit structure of the shift register circuit RS may be simplified, and a size of the shift register circuit RS may be reduced.

It will be noted that the shift register circuit RS further includes other sub-circuits, so that the shift register circuit RS works normally. For example, the other sub-circuits include a sub-circuit for controlling the voltage of the first pull-down node PD1 and a sub-circuit for controlling the voltage of the second pull-down node PD2, etc. The other sub-circuits in the shift register circuit RS are not described in the embodiments of the present disclosure, and they may be any circuit or module capable of achieving corresponding functions in the art. In practical applications, a person skilled in the art may make a selection according to situations, and the present disclosure is not limited thereto.

It will be noted that transistors used in the pixel driving circuit 20 and the shift register circuit RS provided in the embodiments of the present disclosure may be thin film transistors (TFTs), field effect transistors (FETs) or other switching devices with the same characteristics, and the embodiments of the present disclosure are not limited thereto.

In some embodiments, a control electrode of each transistor used in the pixel driving circuit 20 or the shift register circuit RS is a gate of the transistor, a first electrode of the transistor is one of a source and a drain of the transistor, and a second electrode of the transistor is the other of the source and the drain of the transistor. Since a source and a drain of a transistor may be symmetrical in structure, there may be no difference in structure between the source and the drain. That is, there may be no difference in structure between the first electrode and the second electrode of the transistor in the embodiments of the present disclosure. For example, in a case where the transistor is a P-type transistor, the first electrode of the transistor is the source, and the second electrode of the transistor is the drain. For another example, in a case where the transistor is an N-type transistor, the first electrode of the transistor is the drain, and the second electrode of the transistor is the source.

In circuits provided in the embodiments of the present disclosure, the first node N1, the second node N2, the pull-up node PU, the first pull-down node PD1 and the second pull-down node PD2 do not represent actual components, but represent junctions of relevant electrical connections in circuit diagrams. That is, these nodes are nodes equivalent to the junctions of relevant electrical connections in the circuit diagrams.

In the pixel driving circuit 20 and the shift register circuit RS provided in the embodiments of the present disclosure, a specific implementation manner of each sub-circuit is not limited to the manner described above, and may be any used implementation manner, such as, a conventional connection method well known to a person skilled in the art, as long as the realization of corresponding functions is ensured. The above embodiments or examples do not limit the protection scope of the present disclosure. In practical applications, a person skilled in the art may choose to use or not to use one or more of the above circuits according to situations. Various combinations and variations based on the above circuits do not depart from the principle of the present disclosure, and details are not repeated here.

Hereinafter, working processes, in different phases, of the transistors in the pixel driving circuit 20 and the shift register circuit RS applied to the pixel driving circuit 20 will be described in detail by taking an example in which the transistors are the N-type transistors.

The voltage of the first voltage terminal V1 is a DC low-level voltage, and the voltage of the second voltage terminal V2 is also a DC low-level voltage.

Figure 9:
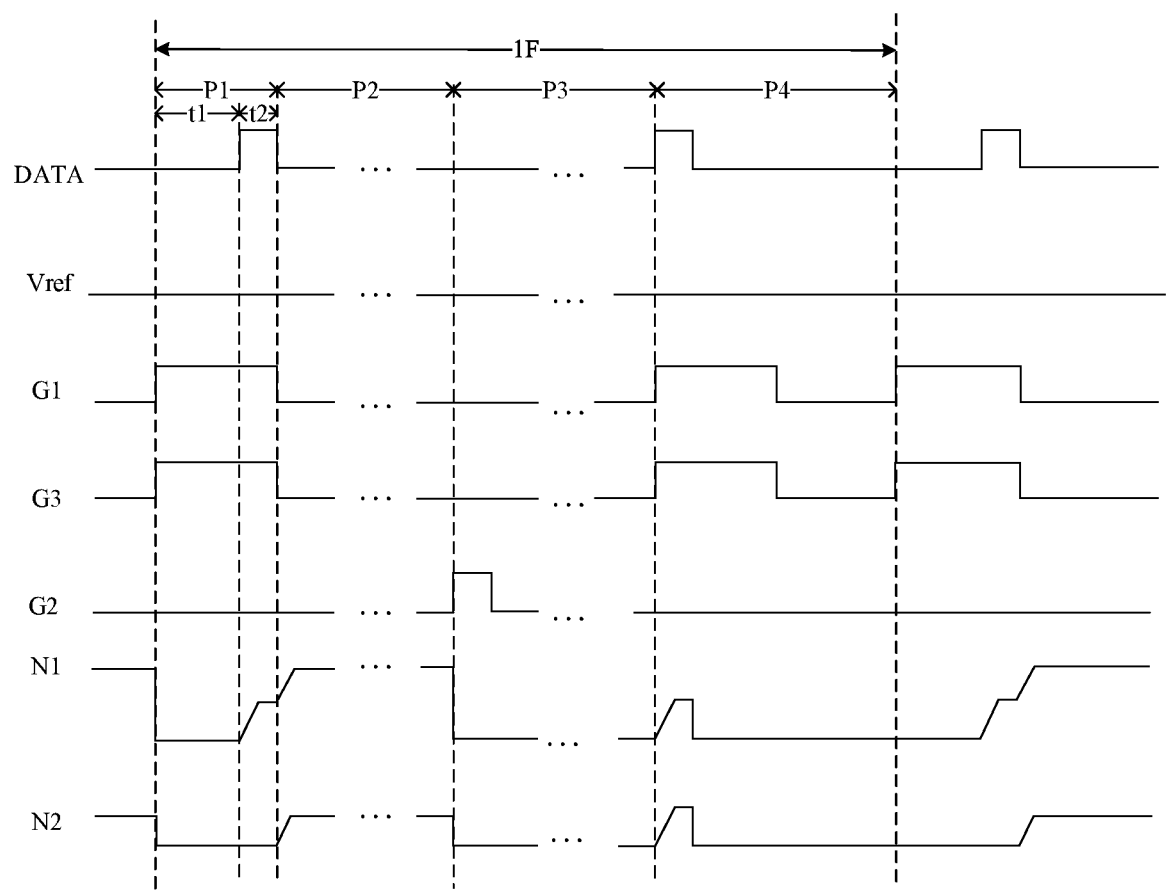
FIG. 9 is a timing diagram of driving signals of a pixel driving circuit, in accordance with some embodiments.

It will be noted that, for convenience of description, for the pixel driving circuit 20, the control signal received at the control signal terminal DB and the sensing signal received at the sensing signal terminal SE are each represented by a DC low-level signal Vref (as shown in FIG. 9).

Figure 10:
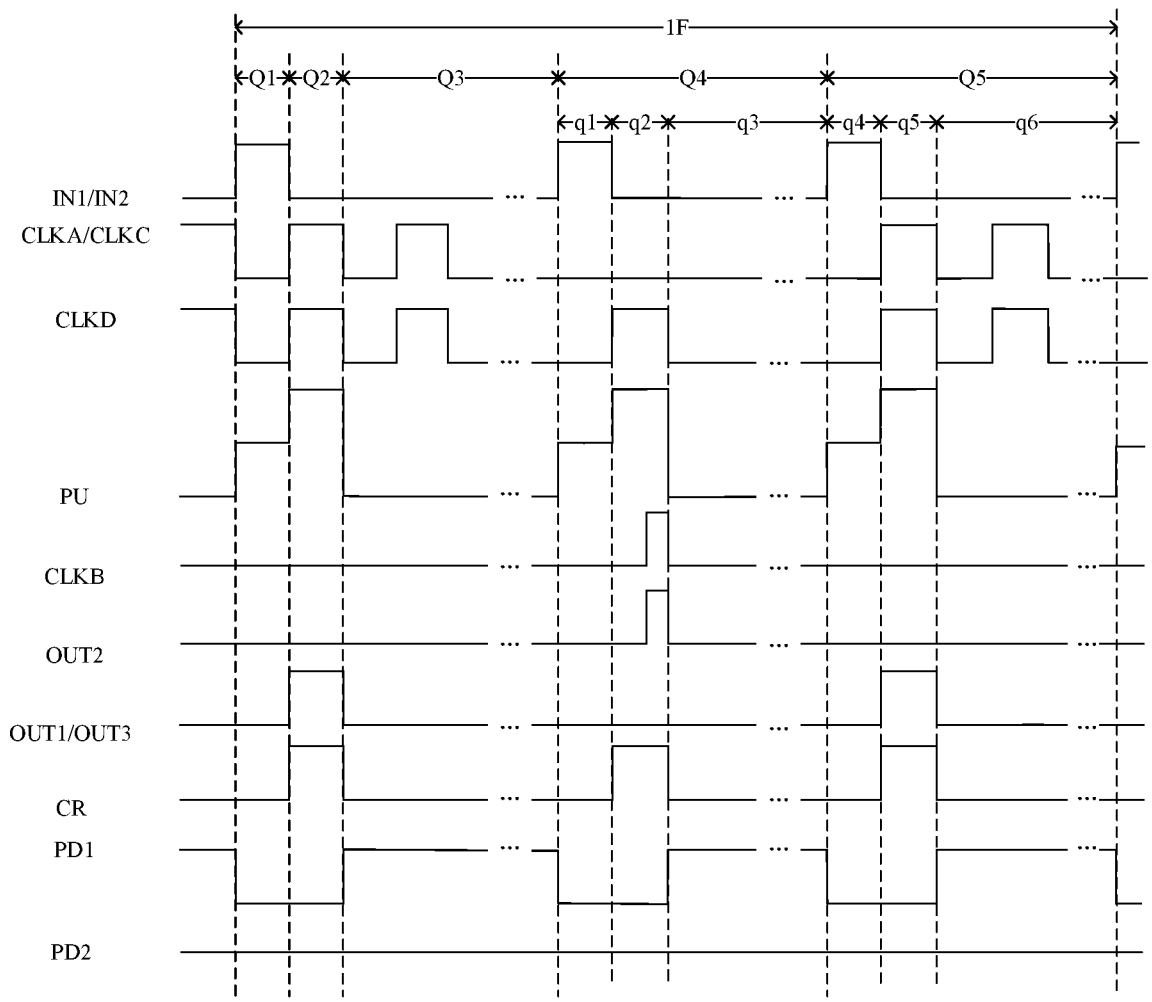
FIG. 10 is a timing diagram of driving signals of a shift register circuit, in accordance with some embodiments.

For convenience of description, working phases (e.g., a first phase Q1 to a fifth phase Q5 as shown in FIG. 10) of the shift register circuit RS are described by taking an example in which noise reduction sub-circuits coupled to the first pull-down node PD1 work and noise reduction sub-circuits coupled to the second pull-down node PD2 do not work.

Moreover, the first signal input terminal IN1 and the second signal input terminal IN2 are coupled to each other, that is, timing of a signal transmitted by the first signal input terminal IN1 and timing of a signal transmitted by the second signal input terminal IN2 are the same.

For the shift register circuit RS, in a first phase Q1 in one image frame (1F) as shown in FIG. 10, referring to FIG. 6, the first input sub-circuit 301 transmits the signal received at the first signal input terminal IN1 to the pull-up node PU to charge the pull-up node PU.

For example, as shown in FIG. 7, the first input sub-circuit 301 transmits a high-level signal received at the first signal input terminal IN1 to the pull-up node PU to charge the pull-up node PU. Meanwhile, the first capacitor C1 and the second capacitor C2 are charged. The fifth transistor T5 transmits a low-level first clock signal to the first signal output terminal OUT1, and the sixth transistor T6 transmits a low-level second clock signal to the second signal output terminal OUT2.

In the case where the shift register circuit RS includes the third output sub-circuit 305, the third capacitor C3 is also charged while the pull-up node PU is charged. In this case, the seventh transistor T7 transmits a low-level third clock signal to the third signal output terminal OUT3.

For the shift register circuit RS, in a second phase Q2 as shown in FIG. 10, the first output sub-circuit 302 is turned on under the control of the voltage of the pull-up node PU to transmit the first clock signal received at the first clock signal terminal CLKA to the first signal output terminal OUT1, so as to transmit the first scanning signal to the first scanning signal terminal G1 of the pixel driving circuit 20.

In the case where the shift register circuit RS includes the third output sub-circuit 305, the third output sub-circuit 305 is turned on under control of a high-level voltage of the pull-up node PU to transmit the third clock signal received at the third clock signal terminal CLKC to the third signal output terminal OUT3, so as to transmit the third scanning signal to the third scanning signal terminal G3 of the pixel driving circuit 20.

In the case where the shift register circuit RS includes the shift signal output sub-circuit 306, the shift signal output sub-circuit 306 is turned on under the control of the high-level voltage of the pull-up node PU to transmit the fourth clock signal received at the fourth clock signal terminal CLKD to the shift signal output terminal CR.

For example, as shown in FIG. 7, the voltage of the pull-up node PU is a high-level voltage, and the voltage of the pull-up node PU continues to increase due to bootstrapping effect of the first capacitor C1. The fifth transistor T5 is turned on under the control of the high-level voltage of the pull-up node PU, and transmits a high-level first clock signal received at the first clock signal terminal CLKA to the first signal output terminal OUT1.

In the case where the shift register circuit RS includes the third output sub-circuit 305, the third capacitor C3 releases stored charge to the pull-up node PU, and the voltage of the pull-up node PU is increased due to bootstrapping effect.

The seventh transistor T7 is turned on, and transmits a high-level third clock signal to the third signal output terminal OUT3.

In the case where the shift register circuit RS includes the shift signal output sub-circuit 306, the eighth transistor T8 is turned on under the control of the high-level voltage of the pull-up node PU, and transmits a high-level fourth clock signal received at the fourth clock signal terminal CLKD to the shift signal output terminal CR.

It will be noted that, signals received at the first clock signal terminal CLKA and the third clock signal terminal CLKC have the same waveform but are not the same signal.

In addition, the sixth transistor T6 in the second output sub-circuit 304 is turned on, and transmits the low-level second clock signal to the second signal output terminal OUT2, so as to transmit a low-level second scanning signal to the second scanning signal terminal G2 of the pixel driving circuit 20.

In this case, for the pixel driving circuit 20, in a first phase P1 in one image frame (1F) as shown in FIG. 9, referring to FIG. 2, under the control of the first scanning signal received at the first scanning signal terminal G1, the data writing sub-circuit 201 connects the data signal terminal DATA to the first node N1, and the data writing sub-circuit 201 writes the data signal received at the data signal terminal DATA into the first node N1.

In the case where the pixel driving circuit 20 includes the sensing sub-circuit 204, the sensing sub-circuit 204 transmits the sensing signal received at the sensing signal terminal SE to the second node N2 under the control of the third scanning signal received at the third scanning signal terminal G3.

For example, in a first period t1 of the first phase P1 as shown in FIG. 9, as shown in FIG. 4, in a case where the first scanning signal received at the first scanning signal terminal G1 is a high-level signal, the third transistor T3 is turned on, and transmits a low-level data signal received at the data signal terminal DATA to the first node N1, so as to reset the first node N1.

In a case where the third scanning signal received at the third scanning signal terminal G3 is a high-level signal, the fourth transistor T4 is turned on, and transmits a low-level sensing signal received at the sensing signal terminal SE to the second node N2, so as to reset the second node N2.

In a second period t2 of the first phase P1 in FIG. 9, the first scanning signal is still the high-level signal, and the third transistor T3 is turned on and writes a high-level data signal received at the data signal terminal DATA into the first node N1, so that the storage capacitor Cst is charged.

For the shift register circuit RS, in a third phase Q3 as shown in FIG. 10, referring to FIG. 6, the first noise reduction sub-circuit 307 transmits the voltage of the first voltage terminal V1 to the first signal output terminal OUT1 under the control of the voltage of the first pull-down node PD1, so as to reduce the noise of the first signal output terminal OUT1. The second noise reduction sub-circuit 308 transmits the voltage of the first voltage terminal V1 to the second signal output terminal OUT2 under the control of the voltage of the first pull-down node PD1, so as to reduce the noise of the second signal output terminal OUT2.

For example, as shown in FIG. 7, the ninth transistor T9 is turned on under control of a high-level voltage of the first pull-down node PD1 to transmit a low-level voltage of the first voltage terminal V1 to the first signal output terminal OUT1, and in this case, a signal of the first signal output terminal OUT1 is a low-level signal. The tenth transistor T10 is turned on under the control of the high-level voltage of the first pull-down node PD1 to transmit the low-level voltage of the first voltage terminal V1 to the second signal output terminal OUT2, and in this case, a signal of the second signal output terminal OUT2 is a low-level signal.

In the case where the shift register circuit RS includes the third noise reduction sub-circuit 309, the third noise reduction sub-circuit 309 transmits the voltage of the first voltage terminal V1 to the third signal output terminal OUT3, so as to reduce the noise of the third signal output terminal OUT3.

For example, as shown in FIG. 7, the eleventh transistor T11 is turned on under the control of the high-level voltage of the first pull-down node PD1 to transmit the low-level voltage of the first voltage terminal V1 to the third signal output terminal OUT3, and in this case, a signal of the third signal output terminal OUT3 is a low-level signal.

In the case where the shift register circuit RS includes the fourth noise reduction sub-circuit 310, the fourth noise reduction sub-circuit 310 transmits the voltage of the second voltage terminal V2 to the shift signal output terminal CR, so as to reduce the noise of the shift signal output terminal CR.

For example, as shown in FIG. 7, the twelfth transistor T12 is turned on under the control of the high-level voltage of the first pull-down node PD1, and transmits the low-level voltage of the second voltage terminal V2 to the shift signal output terminal CR. In this case, a voltage of the shift signal output terminal CR is at a low level, so that the noise of the shift signal output terminal CR is reduced.

It will be noted that, the noise reduction sub-circuits coupled to the first pull-down node PD1 and the noise reduction sub-circuits coupled to the second pull-down node PD2 work alternately in a certain cycle, and duration of the cycle may be designed by a person skilled in the art according to actual situations, which is not limited here. For example, in the image frame as shown in FIG. 10, the voltage of the first pull-down node PD1 is not fixed at a low level, and the voltage of the second pull-down node PD2 is fixed at a low level. In this case, the noise reduction sub-circuits coupled to the first pull-down node PD1 work, and the noise reduction sub-circuits coupled to the second pull-down node PD2 do not work.

In addition, in some embodiments, the noise reduction sub-circuits coupled to the first pull-down node PD1 do not work, and the noise reduction sub-circuits coupled to the second pull-down node PD2 work. In this case, referring to FIG. 6, the fifth noise reduction sub-circuit 311 transmits the voltage of the first voltage terminal V1 to the first signal output terminal OUT1 under the control of the voltage of the second pull-down node PD2, so as to reduce the noise of the first signal output terminal OUT1; and the sixth noise reduction sub-circuit 312 transmits the voltage of the first voltage terminal V1 to the second signal output terminal OUT2, so as to reduce the noise of the second signal output terminal OUT2.

For example, as shown in FIG. 7, the thirteenth transistor T13 is turned on under control of a high-level voltage of the second pull-down node PD2 to transmit a low-level voltage of the first voltage terminal V1 to the first signal output terminal OUT1, and in this case, a signal of the first signal output terminal OUT1 is a low-level signal. The fourteenth transistor T14 is turned on under the control of the high-level voltage of the second pull-down node PD2 to transmit the low-level voltage of the first voltage terminal V1 to the second signal output terminal OUT2, and in this case, a signal of the second signal output terminal OUT2 is a low-level signal.

In the case where the shift register circuit RS includes the seventh noise reduction sub-circuit 313, the seventh noise reduction sub-circuit 313 transmits the voltage of the first voltage terminal V1 to the third signal output terminal OUT3, so as to reduce the noise of the third signal output terminal OUT3.

For example, as shown in FIG. 7, the fifteenth transistor T15 is turned on under the control of the high-level voltage of the second pull-down node PD2 to transmit the low-level voltage of the first voltage terminal V1 to the third signal output terminal OUT3, and in this case, a signal of the third signal output terminal OUT3 is a low-level signal.

In the case where the shift register circuit RS includes the eighth noise reduction sub-circuit 314, the eighth noise reduction sub-circuit 314 transmits the voltage of the second voltage terminal V2 to the shift signal output terminal CR, so as to reduce the noise of the shift signal output terminal CR.

For example, as shown in FIG. 7, the sixteenth transistor T16 is turned on under the control of the high-level voltage of the second pull-down node PD2 to transmit the low-level voltage of the second voltage terminal V2 to the shift signal output terminal CR, and in this case, the voltage of the shift signal output terminal CR is at a low level, so as to reduce the noise of the shift signal output terminal CR.

Therefore, in the third phase Q3 where the shift register circuit RS works, the first signal output terminal OUT1, the second signal output terminal OUT2, the third signal output terminal OUT3 and the shift signal output terminal CR each transmit a low-level signal. In this way, the first scanning signal terminal G1, the second scanning signal terminal G2 and the third scanning signal terminal G3 of the pixel driving circuit 20 each receive a low-level signal.

In this case, for the pixel driving circuit 20, in a second phase P2 as shown in FIG. 9, the data signal terminal DATA is disconnected from the first node N1 under the control of the first scanning signal received at the first scanning signal terminal G1, and the sensing sub-circuit 204 is turned off under the control of the third scanning signal received at the third scanning signal terminal G3.

The driving sub-circuit 202 is turned on under the control of the voltage of the first node N1, and outputs the driving current to drive the light-emitting device L coupled to the second node N2 to emit light under control of the first power supply voltage signal received at the first power supply voltage signal terminal VDD.

For example, as shown in FIG. 4, the third transistor T3 is turned off under control of a low-level first scanning signal received at the first scanning signal terminal G1, and the fourth transistor T4 is turned off under control of a low-level third scanning signal received at the third scanning signal terminal G3.

The second transistor T2 is turned on under control of a high-level voltage of the first node N1, and transmits the first power supply voltage signal of the first power supply voltage signal terminal VDD to the second node N2, so that the voltage of the second node N2 is increased. In addition, due to bootstrapping effect of the storage capacitor Cst, a voltage difference between the first electrode and the second electrode of the storage capacitor Cst may not change suddenly. Therefore, the voltage of the first node N1 continues to increase, which causes the second transistor T2 to maintain on. In this case, under the control of the first power supply voltage signal of the first power supply voltage signal terminal VDD, the second transistor T2 outputs the driving current to drive the light-emitting device L to work (i.e., emit light normally).

After the pixel driving circuit 20 drives the light-emitting device to work for the preset time, for the shift register circuit RS, in a first period q1 of a fourth phase Q4 as shown in FIG. 10, the second input sub-circuit 303 transmits the signal received at the second signal input terminal IN2 to the pull-up node PU.

For example, the second input sub-circuit 303 transmits a high-level signal received at the second signal input terminal IN2 to the pull-up node PU, so that the voltage of the pull-up node PU is at a high level.

In a second period q2 of the fourth phase Q4, the second output sub-circuit 304 is turned on under the control of the voltage of the pull-up node PU, and transmits the second clock signal received at the second clock signal terminal CLKB to the second signal output terminal OUT2, so as to transmit the second scanning signal to the second scanning signal terminal G2 of the pixel driving circuit 20. For example, the sixth transistor T6 is turned on under the control of the high-level voltage of the pull-up node PU, and transmits a high-level second clock signal to the second signal output terminal OUT2, so as to transmit a high-level second scanning signal to the second scanning signal terminal G2 of the pixel driving circuit 20.

In this case, for the pixel driving circuit 20, in a third phase P3 as shown in FIG. 9, the time control sub-circuit 202 is turned on under the control of the second scanning signal received at the second scanning signal terminal G2, and transmits the control signal received at the control signal terminal DB to the first node N1.

The driving sub-circuit 202 is turned off under the control of the voltage of the first node N1, so that no driving current flows in the light-emitting device L and the light-emitting device L stops working. As a result, the working time of the light-emitting device L is shortened, the MPRT is increased, and the motion blur in the process of switching image frames is avoided.

For example, as shown in FIG. 4, the first transistor T1 is turned on under control of the high-level second scanning signal received at the second scanning signal terminal G2, and transmits a low-level control signal received at the control signal terminal DB to the first node N1. In this case, the voltage of the first node N1 is at a low level.

The second transistor T2 is turned off under control of the low-level voltage of the first node N1, and the second transistor T2 stops driving the light-emitting device L to work, thereby shortening the working time of the light-emitting device L.

In this way, in the process of switching image frames, the light-emitting device L stops working before switching to a next image frame, thereby shortening the light-emitting duration of the light-emitting device L. That is, the light-emitting device L stops emitting light, and the display apparatus may present the black image for a period of time, which prolongs the MPRT, thereby avoiding the motion blur in the process of switching image frames due to the continuous working of the light-emitting device L, and improving the display effect.

In addition, the eighth transistor T8 in the shift signal output sub-circuit 306 is turned on under the control of the high-level voltage of the pull-up node PU, and transmits a high-level fourth clock signal received at the fourth clock signal terminal CLKD to the shift signal output terminal CR. The fifth transistor T5 in the first output sub-circuit 302 is turned on under the control of the high-level voltage of the pull-up node PU, and transmits the low-level first clock signal received at the first clock signal terminal CLKA to the first signal output terminal OUT1. The seventh transistor T7 in the third output sub-circuit 305 is turned on under the control of the high-level voltage of the pull-up node PU, and transmits the low-level third clock signal received at the third clock signal terminal CLKC to the third signal output terminal OUT3. In this case, the first scanning signal terminal G1 and the third scanning signal terminal G3 of the pixel driving circuit 20 each transmit a low-level signal, and the third transistor T3 in the data writing sub-circuit 201 and the fourth transistor T4 in the sensing sub-circuit 204 are both turned off.

In a fifth phase Q5 as shown in FIG. 10, the second input sub-circuit 303 transmits the high-level signal received at the second signal input terminal IN2 to the pull-up node PU, so that the voltage of the pull-up node PU is at a high level.

In a third period q3 of the fourth phase Q4, under control of the high-level voltage of the first pull-down node PD1, the first noise reduction sub-circuit 307, the second noise reduction sub-circuit 308, the third noise reduction sub-circuit 309 and the fourth noise reduction sub-circuit 310 in the shift register circuit RS that are coupled to the first pull-down node PD1 work, so as to reduce noise of the first signal output terminal OUT1, the second signal output terminal OUT2, the third signal output terminal OUT3 and the shift signal output terminal CR, respectively. Specific working processes of the first noise reduction sub-circuit 307, the second noise reduction sub-circuit 308, the third noise reduction sub-circuit 309 and the fourth noise reduction sub-circuit 310 in the fourth phase Q4 are similar to working processes thereof in the third phase Q3, which will not be repeated here.

In a fourth period q4 of the fifth phase Q5 as shown in FIG. 10, the second input sub-circuit 303 transmits the high-level signal received at the second signal input terminal IN2 to the pull-up node PU, so that the voltage of the pull-up node PU is at a high level.

In a fifth period q5 of the fifth phase Q5, the first output sub-circuit 302 is turned on under the control of the voltage of the pull-up node PU, and transmits the first clock signal received at the first clock signal terminal CLKA to the first signal output terminal OUT1, so as to transmit the first scanning signal to the first scanning signal terminal G1 of the pixel driving circuit 20.

For example, the fifth transistor T5 is turned on under the control of the high-level voltage of the pull-up node PU, and transmits the high-level first clock signal received at the first clock signal terminal CLKA to the first signal output terminal OUT1.

In the case where the shift register circuit RS includes the third output sub-circuit 305, the third output sub-circuit 305 is turned on under the control of the high-level voltage of the pull-up node PU, and transmits the third clock signal received at the third clock signal terminal CLKC to the third signal output terminal OUT3, so as to transmit the third scanning signal to the third scanning signal terminal G3 of the pixel driving circuit 20.

For example, the seventh transistor T7 is turned on under the control of the high-level voltage of the pull-up node PU, and transmits the high-level third clock signal received at the third clock signal terminal CLKC to the third signal output terminal OUT3.

In this case, for the pixel driving circuit 20, in a fourth phase P4 as shown in FIG. 9, referring to FIG. 2, the data writing sub-circuit 201 writes the data signal received at the data signal terminal DATA into the first node N1 under the control of the first scanning signal received at the first scanning signal terminal G1.

For example, as shown in FIG. 4, the third transistor T3 is turned on under control of a high-level third scanning signal received at the third scanning signal terminal G3, and writes the high-level data signal received at the data signal terminal DATA into the first node N1. As a result, the voltage of the first node N1 is gradually increased, and accordingly, the voltage of the second node N2 synchronously changes with the voltage of the first node N1.

The sensing sub-circuit 204 is turned on under the control of the third scanning signal received at the third scanning signal terminal G3, and transmits the voltage of the second node N2 to the sensing signal terminal SE. For example, the fourth transistor T4 is turned on under the control of the high-level third scanning signal received at the third scanning signal terminal G3, and transmits the voltage of the second node N2 to the sensing signal terminal SE.

In this case, the sensing signal line coupled to the sensing signal terminal SE transmits the voltage of the second node N2 to the external compensation circuit, and the external compensation circuit adjusts the data signal received at the data signal terminal DATA in a subsequent display process according to the voltage of the second node N2. In this way, the threshold voltage of the second transistor T2 in the driving sub-circuit 202 may be compensated by means of external compensation, thereby avoiding difference in the driving current provided by the driving sub-circuit 202 to the light-emitting device L, and improving the brightness uniformity of the display apparatus.

In addition, the eighth transistor T8 in the shift signal output sub-circuit 306 is turned on under the control of the high-level voltage of the pull-up node PU, and transmits the high-level fourth clock signal received at the fourth clock signal terminal CLKD to the shift signal output terminal CR.

In a sixth period q6 of the fifth phase Q5, under the control of the high-level voltage of the first pull-down node PD1, the first noise reduction sub-circuit 307, the second noise reduction sub-circuit 308, the third noise reduction sub-circuit 309 and the fourth noise reduction sub-circuit 310 in the shift register circuit RS that are coupled to the first pull-down node PD1 work, so as to reduce the noise of the first signal output terminal OUT1, the second signal output terminal OUT2, the third signal output terminal OUT3 and the shift signal output terminal CR, respectively. Specific working processes of the first noise reduction sub-circuit 307, the second noise reduction sub-circuit 308, the third noise reduction sub-circuit 309 and the fourth noise reduction sub-circuit 310 in the fifth phase Q5 are similar to the working processes thereof in the third phase Q3, which will not be repeated here.

Figure 11:
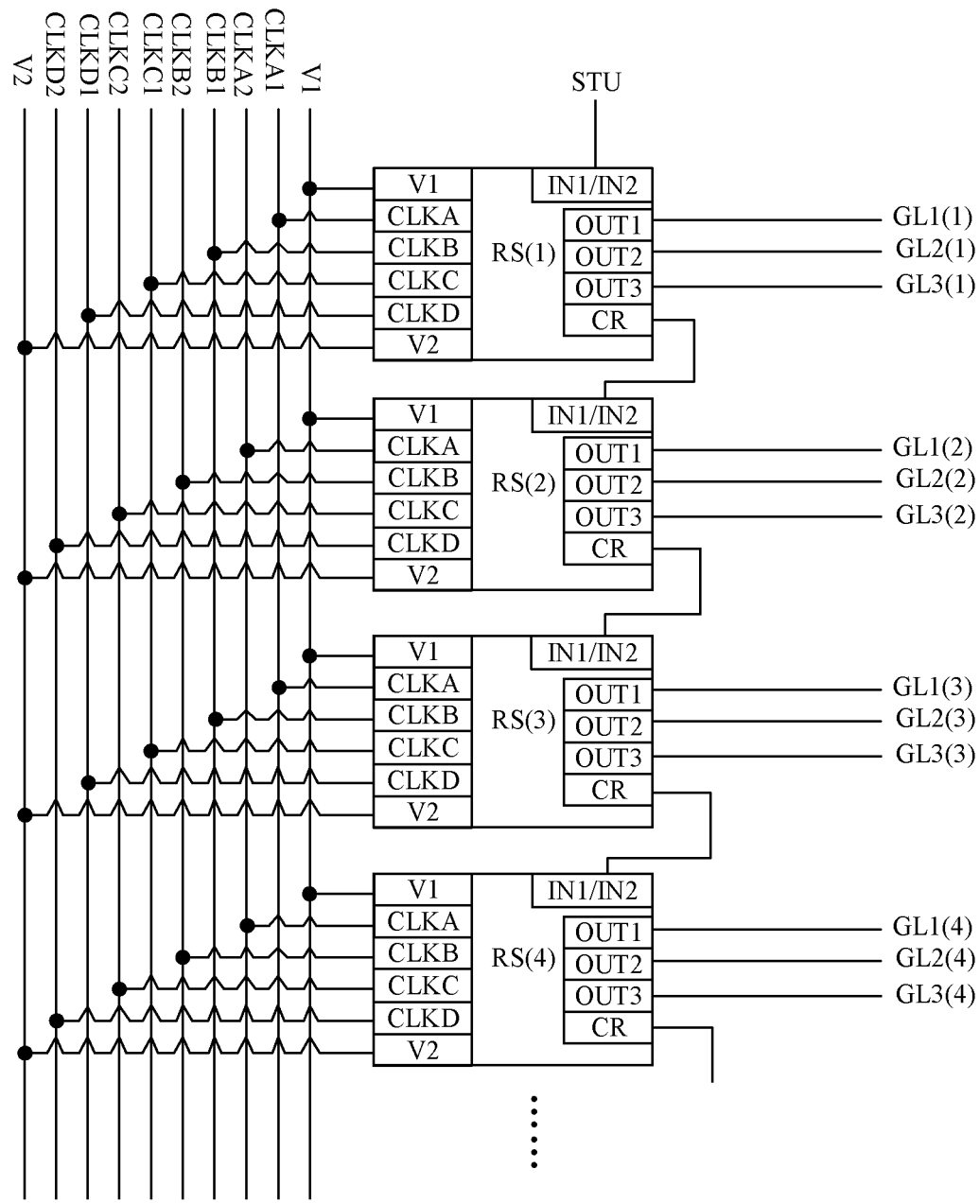
FIG. 11 is a structural diagram of a gate driving circuit, in accordance with some embodiments.

Embodiments of the present disclosure provide a gate driving circuit 10, as shown in FIG. 11, including a plurality of shift register circuits RS that are connected in cascade in any of the above embodiments.

For example, as shown in FIG. 11, a first signal input terminal IN1 of a first shift register circuit RS(1) is coupled to a start signal line STU. The start signal line STU is configured to transmit a start signal. The first shift register circuit RS(1) in the gate driving circuit 10 starts to work after receiving the start signal. Except for the first shift register circuit RS(1), a first signal input terminal IN1 of each shift register circuit is coupled to a shift signal output terminal CR of a previous shift register circuit.

Except for a last shift register circuit RS(n), a reset signal terminal (not shown in the figures) of each shift register circuit is coupled to a shift signal output terminal CR of a next shift register circuit for resetting.

It will be noted that, for convenience of description, FIG. 11 only illustrates an example in which the first signal input terminal IN1 and the second signal input terminal IN2 of the shift register circuit RS are coupled to each other. In a case where the first signal input terminal IN1 and the second signal input terminal IN2 of the shift register circuit RS are different signal terminals, the second signal input terminal IN2 may be coupled to a signal line (not shown in the figures), and a signal transmitted by the signal line to the second signal input terminal IN2 may make the second input sub-circuit 303 achieve corresponding functions.

It will be noted that, any two adjacent shift register circuits RS that are connected in cascade are coupled to different first clock signal lines, different second clock signal lines, different third clock signal lines and different fourth clock signal lines. For example, for an odd-numbered shift register circuit, the first clock signal terminal CLKA is coupled to a first first clock signal line CLKA1, the second clock signal terminal CLKB is coupled to a first second clock signal line CLKB1, the third clock signal terminal CLKC is coupled to a first third clock signal line CLKC1, and the fourth clock signal terminal CLKD is coupled to a first fourth clock signal line CLKD1; and for an even-numbered shift register circuit, the first clock signal terminal CLKA is coupled to a second first clock signal line CLKA2, the second clock signal terminal CLKB is coupled to a second second clock signal line CLKB2, the third clock signal terminal CLKC is coupled to a second third clock signal line CLKC2, and the fourth clock signal terminal CLKD is coupled to a second fourth clock signal line CLKD2.

A signal transmitted by the first first clock signal line CLKA1 and a signal transmitted by the second first clock signal line CLKA2 have a certain phase difference; a signal transmitted by the first second clock signal line CLKB1 and a signal transmitted by the second second clock signal line CLKB2 have a certain phase difference; a signal transmitted by the first third clock signal line CLKC1 and a signal transmitted by the second third clock signal line CLKC2 have a certain phase difference; and a signal transmitted by the first fourth clock signal line CLKD1 and a signal transmitted by the second fourth clock signal line CLKD2 have a certain phase difference.

It will be noted that, for convenience of description, in the embodiments of the present disclosure, some signal terminals, signals transmitted by some signal terminals or signal lines to which some signal terminals are coupled are all represented by the same symbol, but their respective properties are different.

As shown in FIG. 1, a plurality of first scanning signal lines GL1(1) to GL1(n), a plurality of second scanning signal lines GL2(1) to GL2(n), a plurality of third scanning signal lines GL3(1) to GL3(n) and a plurality of data lines DL(1) to DL(m) are provided in the display panel 100.

For example, the first scanning signal lines GL1, the second scanning signal lines GL2, the third scanning signal lines extend in the horizontal direction X, and the data signal lines DL extend in the vertical direction Y.

In this case, one shift register circuit RS is coupled to one first scanning signal line GL1 to transmit the first scanning signal to the first scanning signal line GL1, is coupled to one second scanning signal line GL2 to transmit the second scanning signal to the second scanning signal line GL2, and is coupled to one third scanning signal line GL3 to transmit the third scanning signal to the third scanning signal line GL3.

It will be noted that, for the gate driving circuit 10, FIG. 1 is only an illustration by taking a single-sided driving (that is, the gate driving circuit 10 is provided in the peripheral area S of the display panel 100 and located on a single side of the display area, and the first scanning signal lines GL1 and the second scanning signal lines GL2 are sequentially driven row by row from the single side) as an example. In some other embodiments, a double-sided simultaneous driving (that is, two gate driving circuits 10 are provided in the peripheral area S of the display panel 100 and each gate driving circuit 10 is located on a respective one of two sides of the display area in an extending direction of the first scanning signal lines GL1 and the second scanning signal lines GL2, and the first scanning signal lines GL1 and the second scanning signal lines GL2 are sequentially driven row by row from the two sides simultaneously through the two gate driving circuits 10) may be adopted. In yet some other embodiments, a double-sided alternate driving (that is, two gate driving circuits 10 are provided in the peripheral area S of the display panel 100 and each gate driving circuit 10 is located on a respective one of two sides of the display area in an extending direction of the first scanning signal lines GL1 and the second scanning signal lines GL2, and the first scanning signal lines GL1 and the second scanning signal lines GL2 are sequentially driven row by row from the two sides alternately through the two gate driving circuits 10) may be adopted in the display panel 100.

It will be noted that the gate driving circuit 10 provided in the embodiments of the present disclosure is described by taking the single-sided driving as an example.

In addition, in the gate driving circuit 10, a multi-clock signals mode may be used for each clock signal terminal in the shift register circuit RS. For example, the multi-clock signals mode is a two-clock signals mode, a four-clock signals mode, a six-clock signals mode, an eight-clock signals mode or a ten-clock signals mode, which is not limited in the present disclosure. The gate driving circuit 10 provided in the embodiments of the present disclosure is described by taking the two-clock signals mode as an example.

The display apparatus provided in the embodiments of the present disclosure includes a plurality of pixel driving circuits 20 in any of the above embodiments, and the gate driving circuit 10 in any of the above embodiments.

The gate driving circuit 10 is coupled to each pixel driving circuit 20.

In a case where the pixel driving circuit 20 includes the data writing sub-circuit 201, the time control sub-circuit 203 and the sensing sub-circuit 204, the gate driving circuit 10 transmits the first scanning signal, the second scanning signal and the third scanning signal to the pixel driving circuit 20.

For example, the display apparatus may be any apparatus that displays images whether in motion (e.g., videos) or stationary (e.g., static images), and whether literal or graphical. More specifically, it is anticipated that the embodiments may be implemented in or associated with a variety of electronic apparatuses. The variety of electronic apparatuses include, but are not limited to, for example, mobile phones, wireless apparatuses, personal data assistants (PDAs), hand-held or portable computers, global positioning system (GPS) receivers/navigators, cameras, MPEG-4 Part 14 (MP4) video players, video cameras, game consoles, watches, clocks, calculators, television monitors, flat panel displays, computer monitors, car displays (e.g., odometer displays), navigators, cockpit controllers and/or displays, camera view displays (e.g., of rear view camera displays in vehicles), electronic photos, electronic billboards or signs, projectors, building structures, packaging and aesthetic structures (e.g., displays for displaying an image of a piece of jewelry).

Embodiments of the present disclosure provide a driving method of the pixel driving circuit 20 in any of the above embodiments, and the method includes the follows.

Referring to FIG. 2, the data writing sub-circuit 201 writes the data signal received at the data signal terminal DATA into the first node N1 under the control of the first scanning signal received at the first scanning signal terminal G1.

The driving sub-circuit 202 drives the light-emitting device L coupled to the second node N2 to work under the control of the voltage of the first node N1 and the first power supply voltage signal received at the first power supply voltage signal terminal VDD.

The time control sub-circuit 203 transmits the control signal received at the control signal terminal DB to the first node N1 under the control of the second scanning signal received at the second scanning signal terminal G2 after the light-emitting device L works for the preset time, so that the driving sub-circuit 202 is turned off to control the light-emitting device L to stop working.

In some embodiments, referring to FIG. 2, in the case where the pixel driving circuit 20 includes the sensing sub-circuit 204, the driving method of the pixel driving circuit 20 further includes:

transmitting, by the sensing sub-circuit 204, the sensing signal received at the sensing signal terminal SE to the second node N2 under the control of the third scanning signal received at the third scanning signal terminal G3, while the data writing sub-circuit 201 writes the data signal into the first node N1.

The driving method of the pixel driving circuit 20 has the same beneficial effects as the pixel driving circuit 20, and details will not be repeated here.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register circuit applied to a pixel driving circuit, wherein the pixel driving circuit, comprising:
  a data writing sub-circuit at least coupled to a first scanning signal terminal, a data signal terminal and a first node, the data writing sub-circuit being configured to write a data signal received at the data signal terminal into the first node under control of a first scanning signal received at the first scanning signal terminal;
  a driving sub-circuit coupled to the first node, a second node and a first power supply voltage signal terminal, the driving sub-circuit being configured to drive a light-emitting device coupled to the second node to work under control of a voltage of the first node and a first power supply voltage signal received at the first power supply voltage signal terminal; and
  a time control sub-circuit coupled to the first node, a second scanning signal terminal and a control signal terminal, the time control sub-circuit being configured to transmit a control signal received at the control signal terminal to the first node under control of a second scanning signal received at the second scanning signal terminal after the light-emitting device works for a preset time, so that the driving sub-circuit is turned off to control the light-emitting device to stop working; and the shift register circuit comprising:
  a first output sub-circuit coupled to a first clock signal terminal, a pull-up node and a first signal output terminal, the first output sub-circuit being configured to transmit a first clock signal received at the first clock signal terminal to the first signal output terminal under control of a voltage of the pull-up node, so as to transmit the first scanning signal to the first scanning signal terminal of the pixel driving circuit;
  a second output sub-circuit coupled to a second clock signal terminal, the pull-up node and a second signal output terminal, the second output sub-circuit being configured to transmit a second clock signal received at the second clock signal terminal to the second signal output terminal under the control of the voltage of the pull-up node, so as to transmit the second scanning signal to the second scanning signal terminal of the pixel driving circuit after the pixel driving circuit drives the light-emitting device to work for the preset time;
  a first noise reduction sub-circuit coupled to a first pull-down node, the first signal output terminal and a first voltage terminal, the first noise reduction sub-circuit being configured to transmit a voltage of the first voltage terminal to the first signal output terminal under control of a voltage of the first pull-down node;
  a second noise reduction sub-circuit coupled to the first pull-down node, the second signal output terminal and the first voltage terminal, the second noise reduction sub-circuit being configured to transmit the voltage of the first voltage terminal to the second signal output terminal under the control of the voltage of the first pull-down node;
  a shift signal output sub-circuit coupled to a fourth clock signal terminal, the pull-up node and a shift signal output terminal, the shift signal output sub-circuit being configured to transmit a fourth clock signal received at the fourth clock signal terminal to the shift signal output terminal under the control of the voltage of the pull-up node; and
  a fourth noise reduction sub-circuit coupled to the first pull-down node, the shift signal output terminal and a second voltage terminal, the fourth noise reduction sub-circuit being configured to transmit a voltage of the second voltage terminal to the shift signal output terminal under the control of the voltage of the first pull-down node.

2. The shift register circuit according to claim 1, wherein the time control sub-circuit includes:
  a first transistor, a control electrode of the first transistor being coupled to the second scanning signal terminal, a first electrode of the first transistor being coupled to the control signal terminal, and a second electrode of the first transistor being coupled to the first node.

3. The shift register circuit according to claim 1, wherein the driving sub-circuit includes:
  a second transistor, a control electrode of the second transistor being coupled to the first node, a first electrode of the second transistor being coupled to the second node, and a second electrode of the second transistor being coupled to the first power supply voltage signal terminal.

4. The shift register circuit according to claim 1, wherein the data writing sub-circuit is further coupled to the second node; and
the data writing sub-circuit includes:
a third transistor, a control electrode of the third transistor being coupled to the first scanning signal terminal, a first electrode of the third transistor being coupled to the data signal terminal, and a second electrode of the third transistor being coupled to the first node; and
a storage capacitor, a first electrode of the storage capacitor being coupled to the first node, and a second electrode of the storage capacitor being coupled to the second node.

5. The shift register circuit according to claim 1, further comprising:
a sensing sub-circuit coupled to a third scanning signal terminal, the second node and a sensing signal terminal, the sensing sub-circuit being configured to transmit a sensing signal received at the sensing signal terminal to the second node under control of a third scanning signal received at the third scanning signal terminal.

6. The shift register circuit according to claim 5, wherein the sensing sub-circuit includes:
a fourth transistor, a control electrode of the fourth transistor being coupled to the third scanning signal terminal, a first electrode of the fourth transistor being coupled to the sensing signal terminal, and a second electrode of the fourth transistor being coupled to the second node.

7. The shift register circuit according to claim 1, wherein the first output sub-circuit includes:
a fifth transistor, a control electrode of the fifth transistor being coupled to the pull-up node, a first electrode of the fifth transistor being coupled to the first clock signal terminal, and a second electrode of the fifth transistor being coupled to the first signal output terminal; and
a first capacitor, a first electrode of the first capacitor being coupled to the pull-up node, and a second electrode of the first capacitor being coupled to the first signal output terminal; and
the second output sub-circuit includes:
a sixth transistor, a control electrode of the sixth transistor being coupled to the pull-up node, a first electrode of the sixth transistor being coupled to the second clock signal terminal, and a second electrode of the sixth transistor being coupled to the second signal output terminal; and
a second capacitor, a first electrode of the second capacitor being coupled to the pull-up node, and a second electrode of the second capacitor being coupled to the second signal output terminal.

8. The shift register circuit according to claim 1, wherein the pixel driving circuit includes a sensing sub-circuit coupled to a third scanning signal terminal, the second node and a sensing signal terminal, and configured to transmit a sensing signal received at the sensing signal terminal to the second node under control of a third scanning signal received at the third scanning signal terminal; and the shift register circuit further comprises:
a third output sub-circuit coupled to a third clock signal terminal, the pull-up node and a third signal output terminal, the third output sub-circuit being configured to transmit a third clock signal received at the third clock signal terminal to the third signal output terminal under the control of the voltage of the pull-up node, so as to transmit the third scanning signal to the third scanning signal terminal of the pixel driving circuit.

9. The shift register circuit according to claim 8, wherein the third output sub-circuit includes:
a seventh transistor, a control electrode of the seventh transistor being coupled to the pull-up node, a first electrode of the seventh transistor being coupled to the third clock signal terminal, and a second electrode of the seventh transistor being coupled to the third signal output terminal; and
a third capacitor, a first electrode of the third capacitor being coupled to the pull-up node, and a second electrode of the third capacitor being coupled to the third signal output terminal.

10. The shift register circuit according to claim 1, wherein the shift signal output sub-circuit includes:
an eighth transistor, a control electrode of the eighth transistor being coupled to the pull-up node, a first electrode of the eighth transistor being coupled to the fourth clock signal terminal, and a second electrode of the eighth transistor being coupled to the shift signal output terminal.

11. The shift register circuit according to claim 1,
the pixel driving circuit includes a sensing sub-circuit coupled to a third scanning signal terminal, the second node and a sensing signal terminal, and configured to transmit a sensing signal received at the sensing signal terminal to the second node under control of a third scanning signal received at the third scanning signal terminal; and the shift register circuit further comprises:
a third output sub-circuit coupled to a third clock signal terminal, the pull-up node and a third signal output terminal, the third output sub-circuit being configured to transmit a third clock signal received at the third clock signal terminal to the third signal output terminal under the control of the voltage of the pull-up node, so as to transmit the third scanning signal to the third scanning signal terminal of the pixel driving circuit; and
a third noise reduction sub-circuit coupled to the first pull-down node, the third signal output terminal and the first voltage terminal, the third noise reduction sub-circuit being configured to transmit the voltage of the first voltage terminal to the third signal output terminal under the control of the voltage of the first pull-down node.

12. The shift register circuit according to claim 11, wherein
the first noise reduction sub-circuit includes:
a ninth transistor, a control electrode of the ninth transistor being coupled to the first pull-down node, a first electrode of the ninth transistor being coupled to the first voltage terminal, and a second electrode of the ninth transistor being coupled to the first signal output terminal;
the second noise reduction sub-circuit includes:
a tenth transistor, a control electrode of the tenth transistor being coupled to the first pull-down node, a first electrode of the tenth transistor being coupled to the first voltage terminal, and a second electrode of the tenth transistor being coupled to the second signal output terminal;
the third noise reduction sub-circuit includes:
an eleventh transistor, a control electrode of the eleventh transistor being coupled to the first pull-down node, a first electrode of the eleventh transistor being coupled to the first voltage terminal, and a second electrode of the eleventh transistor being coupled to the third signal output terminal; and the fourth noise reduction sub-circuit includes:
a twelfth transistor, a control electrode of the twelfth transistor being coupled to the first pull-down node, a first electrode of the twelfth transistor being coupled to the second voltage terminal, and a second electrode of the twelfth transistor being coupled to the shift signal output terminal.

13. The shift register circuit according to claim 1, further comprising:
a fifth noise reduction sub-circuit coupled to a second pull-down node, the first signal output terminal and a first voltage terminal, the fifth noise reduction sub-circuit being configured to transmit a voltage of the first voltage terminal to the first signal output terminal under control of a voltage of the second pull-down node;
a sixth noise reduction sub-circuit coupled to the second pull-down node, the second signal output terminal and the first voltage terminal, the sixth noise reduction sub-circuit being configured to transmit the voltage of the first voltage terminal to the second signal output terminal under the control of the voltage of the second pull-down node;
a shift signal output sub-circuit coupled to a fourth clock signal terminal, the pull-up node and a shift signal output terminal, the shift signal output sub-circuit being configured to transmit a fourth clock signal received at the fourth clock signal terminal to the shift signal output terminal under the control of the voltage of the pull-up node; and
an eighth noise reduction sub-circuit coupled to the second pull-down node, the shift signal output terminal and a second voltage terminal, the eighth noise reduction sub-circuit being configured to transmit a voltage of the second voltage terminal to the shift signal output terminal under the control of the voltage of the second pull-down node; wherein
the pixel driving circuit includes a sensing sub-circuit coupled to a third scanning signal terminal, the second node and a sensing signal terminal, and configured to transmit a sensing signal received at the sensing signal terminal to the second node under control of a third scanning signal received at the third scanning signal terminal; and the shift register circuit further comprises:
a third output sub-circuit coupled to a third clock signal terminal, the pull-up node and a third signal output terminal, the third output sub-circuit being configured to transmit a third clock signal received at the third clock signal terminal to the third signal output terminal under the control of the voltage of the pull-up node, so as to transmit the third scanning signal to the third scanning signal terminal of the pixel driving circuit; and
a seventh noise reduction sub-circuit coupled to the second pull-down node, the third signal output terminal and the first voltage terminal, the seventh noise reduction sub-circuit being configured to transmit the voltage of the first voltage terminal to the third signal output terminal under the control of the voltage of the second pull-down node.

14. The shift register circuit according to claim 13, wherein
the fifth noise reduction sub-circuit includes:
a thirteenth transistor, a control electrode of the thirteenth transistor being coupled to the second pull-down node, a first electrode of the thirteenth transistor being coupled to the first voltage terminal, and a second electrode of the thirteenth transistor being coupled to the first signal output terminal;
the sixth noise reduction sub-circuit includes:
a fourteenth transistor, a control electrode of the fourteenth transistor being coupled to the second pull-down node, a first electrode of the fourteenth transistor being coupled to the first voltage terminal, and a second electrode of the fourteenth transistor being coupled to the second signal output terminal;
the seventh noise reduction sub-circuit includes:
a fifteenth transistor, a control electrode of the fifteenth transistor being coupled to the second pull-down node, a first electrode of the fifteenth transistor being coupled to the first voltage terminal, and a second electrode of the fifteenth transistor being coupled to the third signal output terminal; and
the eighth noise reduction sub-circuit includes:
a sixteenth transistor, a control electrode of the sixteenth transistor being coupled to the second pull-down node, a first electrode of the sixteenth transistor being coupled to the second voltage terminal, and a second electrode of the sixteenth transistor being coupled to the shift signal output terminal.

15. A gate driving circuit, comprising a plurality of shift register circuits that are connected in cascade according to claim 1.

16. A display apparatus, comprising:
a gate driving circuit according to claim 15;
a plurality of pixel driving circuits, each pixel driving circuit coupled to the gate driving circuit; and
a plurality of light-emitting devices, the pixel driving circuit being coupled to at least one light-emitting device.

* * * * *

UNITED STATES PATENT AND TRADEMARK OFFICE
CERTIFICATE OF CORRECTION

PATENT NO. : 11,869,426 B2
APPLICATION NO. : 17/763818
DATED : January 9, 2024
INVENTOR(S) : Yongqian Li and Xuehuan Feng It is certified that error appears in the above-identified patent and that said Letters Patent is hereby corrected as shown below:

In the Claims

In Column 28, Line 21, In Claim 11 please change "claim 1," to --claim 1, wherein--

Signed and Sealed this
Ninth Day of April, 2024

Katherine Kelly Vidal
*Director of the United States Patent and Trademark Office*